(12) United States Patent
Goto

(10) Patent No.: US 8,747,049 B2
(45) Date of Patent: Jun. 10, 2014

(54) TRANSFERRING APPARATUS

(75) Inventor: Hirohiko Goto, Akashi (JP)

(73) Assignee: Kawasaki Jukogyo Kabushiki Kaisha, Hyogo (JP)

( * ) Notice: Subject to any disclaimer, the term of this patent is extended or adjusted under 35 U.S.C. 154(b) by 675 days.

(21) Appl. No.: 13/019,624

(22) Filed: Feb. 2, 2011

(65) Prior Publication Data

US 2011/0293395 A1 Dec. 1, 2011

(30) Foreign Application Priority Data

Feb. 8, 2010 (JP) ................................. 2010-025836

(51) Int. Cl.
*B25J 15/00* (2006.01)
*B25J 9/04* (2006.01)
*B25J 9/02* (2006.01)
*B25J 9/10* (2006.01)

(52) U.S. Cl.
USPC ..................... 414/744.5; 74/490.03; 901/40

(58) Field of Classification Search
USPC .............. 414/744.3, 744.4, 744.5; 74/490.01, 74/490.03, 490.04; 901/15, 19, 28
See application file for complete search history.

(56) References Cited

U.S. PATENT DOCUMENTS

| | | | | |
|---|---|---|---|---|
| 4,483,654 A * | 11/1984 | Koch et al. | ................. | 414/744.5 |
| 4,897,015 A * | 1/1990 | Abbe et al. | ................. | 414/744.8 |
| 5,046,992 A * | 9/1991 | Tamai et al. | ................. | 474/84 |
| 5,064,340 A * | 11/1991 | Genov et al. | ................. | 414/744.5 |
| 5,838,121 A * | 11/1998 | Fairbairn et al. | ................. | 318/45 |
| 6,155,768 A * | 12/2000 | Bacchi et al. | ............. | 414/416.03 |
| 6,764,271 B2 * | 7/2004 | Momoki | .................... | 414/744.5 |
| 6,826,977 B2 * | 12/2004 | Grover et al. | ............. | 74/490.03 |
| 7,192,241 B2 * | 3/2007 | Momoki | .................... | 414/744.5 |
| 2007/0151388 A1 * | 7/2007 | Yazawa et al. | ................. | 74/490.01 |
| 2008/0249651 A1 * | 10/2008 | Hosek et al. | ................. | 700/121 |
| 2010/0178146 A1 * | 7/2010 | Kremerman et al. | ...... | 414/744.5 |
| 2010/0280654 A1 * | 11/2010 | Rice et al. | ................... | 700/228 |

FOREIGN PATENT DOCUMENTS

| JP | A-11-277467 | 10/1999 |
|---|---|---|
| JP | A-2004-288718 | 10/2004 |
| JP | A-2009-50986 | 3/2009 |

* cited by examiner

*Primary Examiner* — Gregory Adams
(74) *Attorney, Agent, or Firm* — Oliff PLC

(57) ABSTRACT

A transferring apparatus 1 includes a revolving base 13, two hand mechanisms 13 and 14, and two hand drive mechanisms 30 and 40. The hand mechanisms 13 and 14 are provided at a revolving base 13 so as to be rotatable about rotation axes L2 and L3, respectively. The hand mechanisms 13 and 14 are configured to be individually rotatable by hand drive mechanisms 30 and 40, respectively. Each of the hand mechanisms 13 and 14 includes an arm 20, a hand 21, and an interlock mechanism 26. The arms 21 are provided at the revolving link so as to be rotatable about the rotation axes L2 and L3, respectively. The hands 20 are respectively provided at the arms 21 so as to be rotatable about the hand axes L4 and L5, respectively. The interlock mechanism 26 is configured such that a reduction ratio of the hand 21 to the arm 20 is 1.55, and the arm 20 and the hand 21 operate in conjunction with each other.

6 Claims, 22 Drawing Sheets

US 8,747,049 B2

TRANSFERRING APPARATUS

TECHNICAL FIELD

The present invention relates to a transferring apparatus configured to transfer wafers, such as semiconductor wafers and glass wafers.

BACKGROUND ART

A multi chamber system that is semiconductor processing equipment has been known. The multi chamber system includes a plurality of semiconductor processing chambers and a load lock chamber. Each of the semiconductor processing chambers and the load lock chamber is connected to one transferring room via a gate, and a transferring apparatus is arranged in the transferring room. One example of the transferring apparatus is a transferring apparatus including two hands, which is disclosed in Japanese Laid-Open Patent Application Publication No. 2009-50986.

This transferring apparatus includes a revolving base and two arms. The revolving base is rotated by a revolution drive unit. The two arms are rotatably attached to the revolving base. The two arms are connected to one arm drive unit via, for example, a transmission belt. The arm drive unit is configured to drive the transmission belt to rotate the two arms in conjunction with each other. The hand capable of holding a wafer is formed at a tip end portion of each of the arms which operate in conjunction with each other.

In accordance with the transferring apparatus configured as above, the arm drive unit rotates the arm while the revolution drive unit rotates the revolving base. Thus, the transferring apparatus transfers the semiconductor wafer held by the hand. As above, the transferring apparatus capable of transferring the semiconductor wafer takes the semiconductor wafer from the load lock chamber and the semiconductor processing chamber, transfers the semiconductor wafer to a predetermined mounting position of the next semiconductor processing chamber, and mounts the semiconductor wafer on the mounting position. The semiconductor wafer having been transferred to the mounting position is subjected to a predetermined process treatment and is then further transferred to the next mounting position by the transferring apparatus.

Because of its configuration, the transferring apparatus described in Japanese Laid-Open Patent Application Publication No. 2009-50986 can transfer the semiconductor wafer only radially about a revolution axis that is a revolution center of the revolving base. Therefore, even if the transferring apparatus described in PTL 1 transfers the semiconductor wafer in a case where the mounting positions are radially arranged and the gates face the revolution center, the semiconductor wafer and the arm do not contact the gates. However, since the mounting positions and the directions of the gates change depending on contents of the process treatments, the shapes and positions of the semiconductor processing chambers, and the like, the gates are not always facing the revolution center. If the transferring apparatus described in PTL 1 transfers the semiconductor wafer in a case where the gate is not facing the revolution center, the hand obliquely approaches to the gate, and the semiconductor wafer and the arm contact the gate. Such contact of the semiconductor wafer and the arm is avoidable by widening the gates of the semiconductor processing chambers. However, in such case, the outer diameter of the transferring room increase, and the semiconductor processing equipment increases in size.

Here, an object of the present invention is to provide a transferring apparatus capable of inserting a wafer into a gate substantially linearly regardless of the position on which the wafer is mounted and the direction of the gate.

SUMMARY OF INVENTION

A transferring apparatus of the present invention includes: a revolving link configured to revolve about a predetermined revolution axis; two hand mechanisms, each of which is configured to hold a wafer and both of which are attached to the revolving link so as to be rotatable about two rotating axes, respectively, the rotating axes being parallel to the revolution axis; and two hand drive mechanisms configured to rotate the hand mechanisms, respectively, wherein each of the hand mechanisms includes: an arm attached to the revolving link so as to be rotatable about the rotating axis and configured to be rotated by the hand drive mechanism; a hand provided at the arm so as to be rotatable about a hand axis parallel to the rotating axis and configured to hold the wafer; and an interlock mechanism configured to rotate the hand in conjunction with rotation of the arm, and the interlock mechanism is configured such that a reduction ratio of rotation of the hand to rotation of the arm is not lower than 1.35 and not higher than 1.65.

In accordance with the present invention, since the hand is rotatably provided at the arm, the hand mechanism can bend and extend. With this, the range of movement of the hand becomes wide. The hand and the arm operate in conjunction with each other, and the reduction ratio is set in a range of not lower than 1.35 and not higher than 1.65. With this, by rotating the arm while adjusting the amount of rotation of the revolving base, the hand can face in various directions and can be moved substantially linearly in such directions. Therefore, the wafer can be inserted into the gate substantially linearly regardless of the position where the wafer is mounted and the direction of the gate.

In the above invention, it is preferable that: the interlock mechanism include a rotating axis pulley fixed to the revolving link so as to be rotatable about the rotating axis, a hand axis pulley provided at the arm so as to be rotatable about the hand axis, and a hand belt hanging between the hand axis pulley and the rotating axis pulley; and the hand be fixed to the hand axis pulley.

In accordance with the above configuration, when the arm is rotated by the hand drive mechanism, the rotating axis pulley rotates, and the hand axis pulley rotates via the hand belt. With this, the hand fixed to the hand axis pulley rotates, and the arm and the hand operate in conjunction with each other. As above, the arm and the hand operate in conjunction with each other by using two pulleys. Therefore, only by selecting the change gear ratio between two pulleys, the reduction ratio of the arm and the hand can be set. Thus, the reduction ratio can be set easily within the above-described range.

In the above invention, it is preferable that: each of the hand drive mechanisms include an arm drive motor, an arm output shaft rotated by the arm drive motor, an intermediate pulley rotated in conjunction with the arm output shaft, an arm pulley fixed to the arm so as to be rotatable about the rotating axis, and an arm belt hanging between the intermediate pulley and the arm pulley; and the intermediate pulleys of the two hand drive mechanisms be arranged in an internal space of the revolving link so as to be the same in height as each other.

In accordance with the above-described configuration, when the arm drive motor rotates, the intermediate pulley rotates via the arm output shaft. The arm pulley is rotated by the intermediate pulley via the arm belt. With this, the arm fixed to the arm pulley rotates. One intermediate pulley for rotating the arm as above is included in each of the two hand drive mechanisms, and these intermediate pulleys are arranged so as to be the same in height as each other. Therefore, the height of the transferring apparatus can be reduced as compared to a case where two intermediate pulleys are arranged to be lined up in the upper-lower direction. With this, the transferring room in which the transferring apparatus is arranged can be reduced in height, and the equipment including the transferring apparatus can be reduced in height.

In the above invention, it is preferable that one of the arm output shafts of the two hand drive mechanisms be formed to have a tubular shape, and the other arm output shaft be fittingly inserted in the above-described one of the arm output shafts.

In accordance with the above-described configuration, two arm output shafts are arranged to be lined up along the revolution axis, and one of the arm output shafts is inserted through the other one. With this, an installation space for the two arm output shafts can be reduced.

In the above invention, it is preferable that the transferring apparatus further include a revolution drive mechanism configured to revolve the revolving link and a controller configured to control operations of the revolution drive mechanism and the two arm drive motors, and the controller be configured to: rotate the arm and the hand by the arm drive motor to extend the hand mechanism; revolve the revolving link by the revolution drive mechanism; and thus move the hand linearly in a direction in which the hand faces.

In accordance with the above-described configuration, by extending the hand mechanism while adjusting the rotation of the revolving base by the controller, the hand can be moved linearly in a direction in which the hand faces.

The above object, other objects, and features of the present invention are made clear by the following detailed explanation with reference to the attached drawings.

DETAILED EXPLANATION OF PREFERRED EMBODIMENTS

Figure 1:
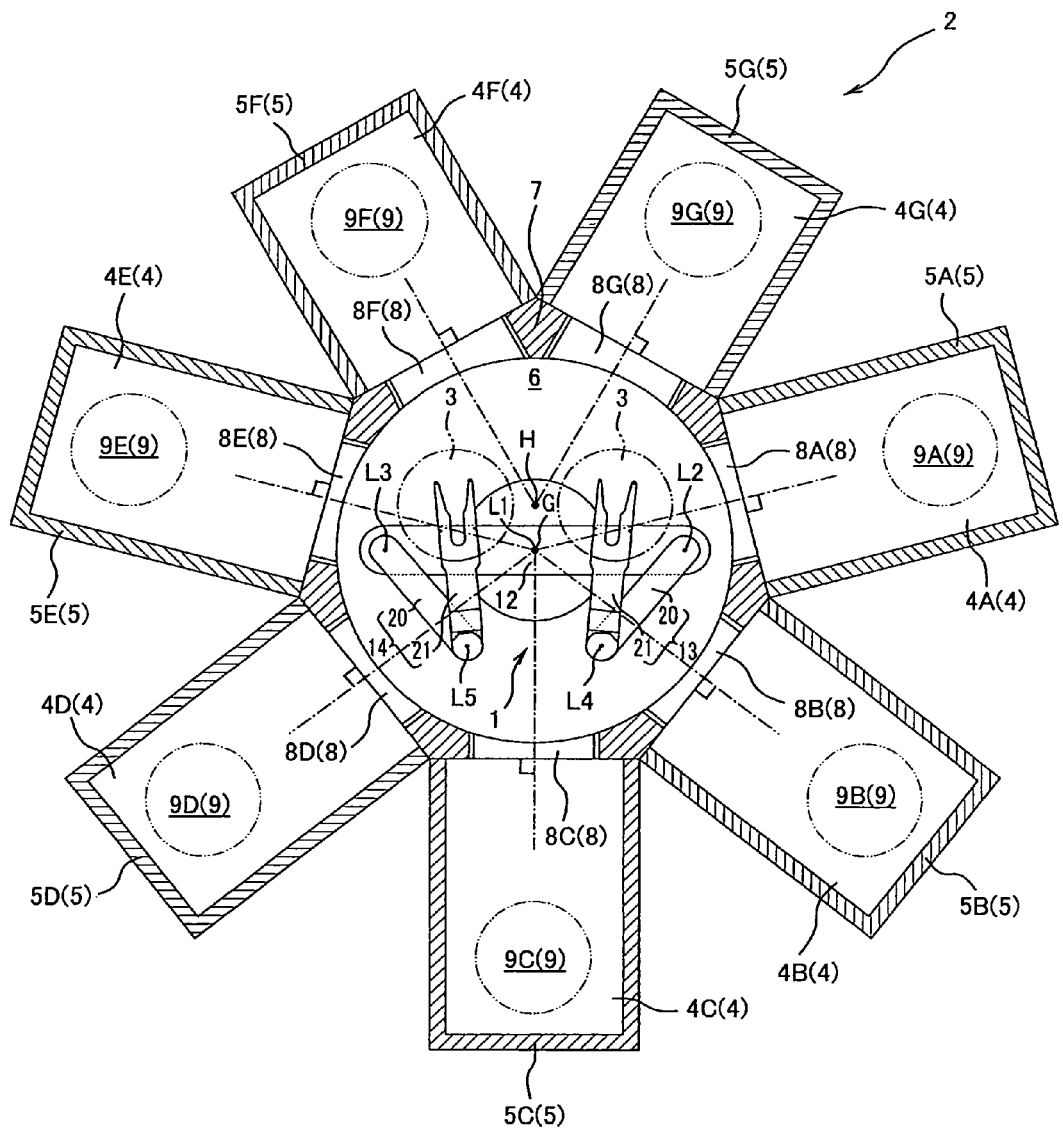
FIG. 1 is a plan view showing semiconductor processing equipment including a transferring apparatus according to an embodiment of the present invention.

Hereinafter, semiconductor processing equipment 2 including a transferring apparatus 1 according to an embodiment of the present invention will be explained in reference the drawings. A concept of directions, such as upper, lower, left, right, front, and rear directions, in this embodiment is used for convenience of explanation. This concept does not limit the positions, directions, and the like of the transferring apparatus 1 and the semiconductor processing equipment 2. In addition, the transferring apparatus 1 explained below is just one embodiment of the present invention. The present invention is not limited to the embodiments, and additions, eliminations, and modifications may be made within the spirit of the present invention.

Semiconductor Processing Equipment

The semiconductor processing equipment 2 is equipment configured to carry out various process treatments, such as a heat treatment, an impurity introducing treatment, a thin film forming treatment, a lithography treatment, a washing treatment, and a flattening treatment, with respect to a wafer 3. In the present invention, examples of the wafer 3 are semiconductor wafers and glass wafers. Examples of the semiconductor wafer are silicon wafers, sapphire (single-crystal alumina) wafers, and the other various wafers. Examples of the glass wafer are FPD (Flat Panel Display) glass substrates and MEMS (Micro Electro Mechanical Systems) glass substrates.

The semiconductor processing equipment 2 includes a plurality of process chambers 5 in which rooms 4 are respectively formed. Examples of the rooms 4 are a load lock chamber in which the wafer 3 transferred stands by and a treatment room in which the wafer 3 is subjected to various process treatments. In the present embodiment, the semiconductor processing equipment 2 includes seven rooms 4A to 4G and seven process chambers 5A to 5G The seven rooms 4A to 4G are connected to one transferring room 6. The transferring room 6 is formed in a transferring chamber 7. The outer shape of the transferring chamber 7 is a polygon in plan view. The number of sides of the polygon is equal to or larger than the number of process chambers 5 included in the semiconductor processing equipment 2. In the present embodiment, the transferring chamber 7 has a substantially regular heptagonal shape.

Gates 8 are respectively formed at the sides of the transferring chamber 7, and process chambers 7 are provided at the sides of the transferring chamber 7. The rooms 4A to 4G respectively formed in the process chambers 5 are connected to the transferring room 6 via the gates 8. In each of the rooms 4A to 4G, a mounting position 9 is predefined, on which the wafer 3 is mounted when the wafer 3 is subjected to various process treatments or when the wafer 3 stands by (see chain double-dashed lines). The gates 8A to 8G via which the transferring room 6 and the rooms 4A to 4G are connected are formed such that the wafer 3 can be linearly inserted toward the mounting positions 9A to 9G Specifically, each of the gates 8A to 8G opens in a direction which coincides with a depth direction (front-rear direction) of a corresponding one of the rooms 4A to 4G and is perpendicular to a corresponding one of the sides of the transferring chamber 7. Among the gates 8A to 8G formed as above, the five gates 8A to 8E faces a gravity center G of the transferring chamber 7, but the remaining two gates 8F and 8G face a position H that is different from the gravity center G The mounting positions 9F and 9G of the two rooms 4F and 4G respectively connected the gates 8F and 8G each facing in a direction different from the direction of the gravity center G are positioned eccentrically with respect to the gravity center G In contrast, the mounting positions 9A to 9E of the rooms 4A to 4E respectively connected to the gates 8A to 8E facing the gravity center G are positioned radially with respect to the gravity center G.

The transferring room 6 has a substantially circular shape (or a regular polygonal shape) in plan view, and the center thereof substantially coincides with the gravity center G of the transferring chamber 7. The transferring apparatus 1 is arranged in the transferring room 6 configured as above. An inner diameter of the transferring room 6 is slightly larger than a revolution radius of a revolving link 12 of the below-described transferring apparatus 1. The transferring apparatus 1 is configured to be capable of transferring the wafer 3 to the mounting positions 9F and 9G eccentrically arranged and the mounting positions 9A to 9E radially arranged and taking the wafer 3 therefrom. Hereinafter, a specific configuration of the transferring apparatus 1 will be explained in reference to FIGS. 1 to 5.

Transferring Apparatus

Figure 2:
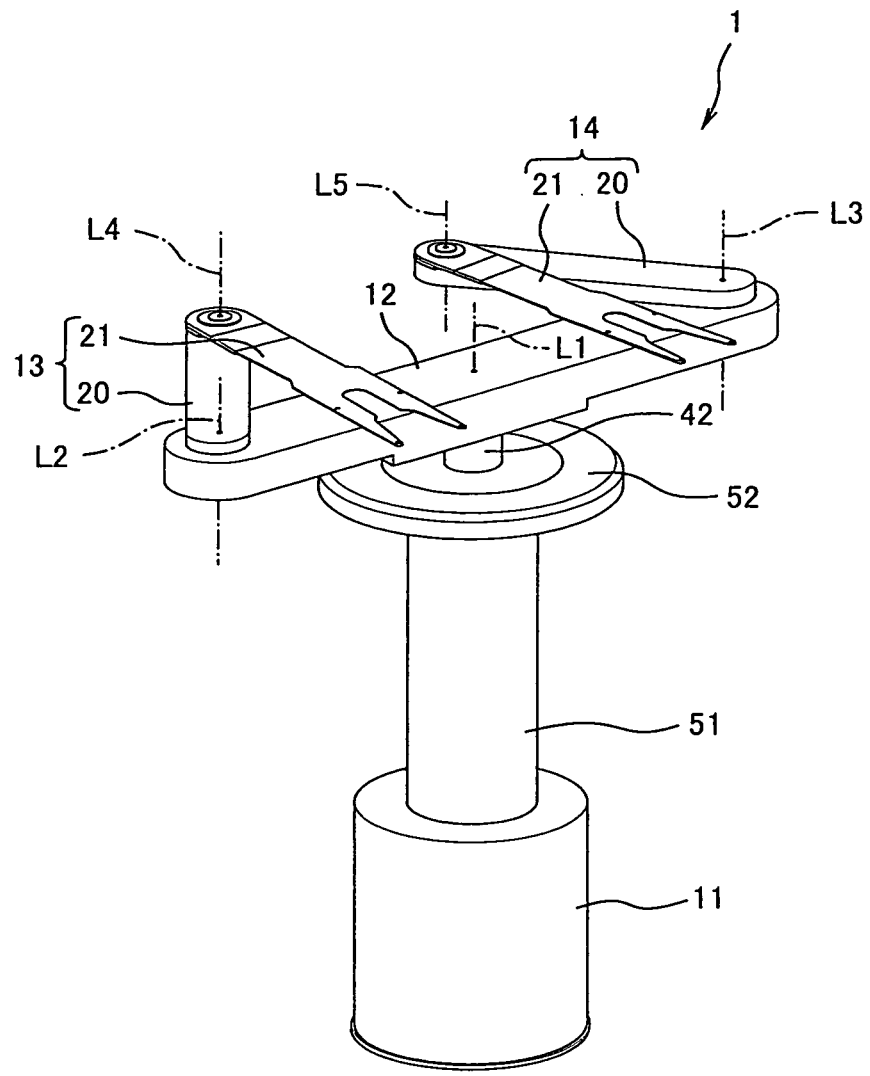
FIG. 2 is a perspective view of the transferring apparatus of FIG. 1 when viewed obliquely from above.
Figure 3:
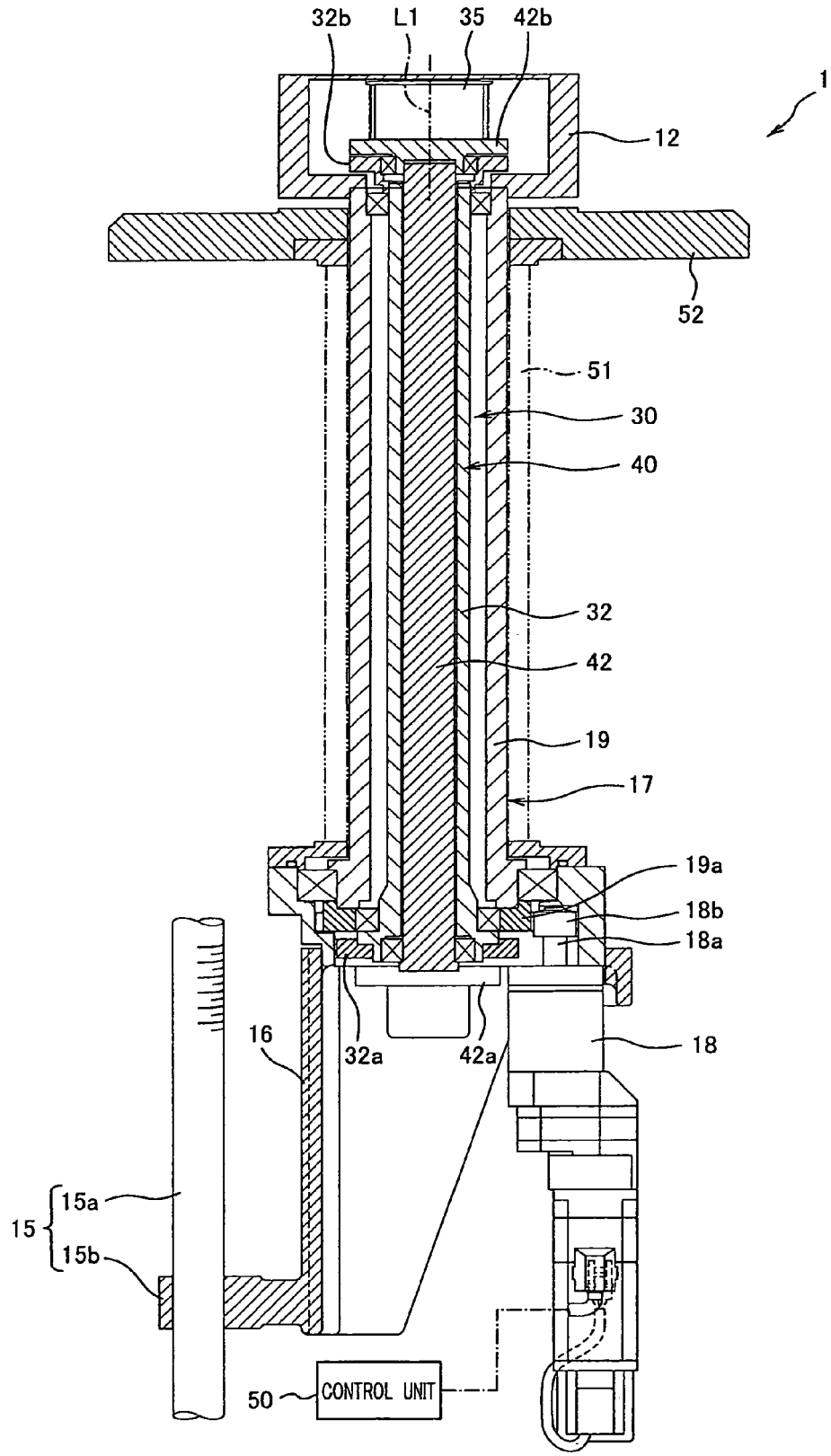
FIG. 3 is an enlarged cross-sectional view showing a cross section of the transferring apparatus of FIG. 1 when the transferring apparatus is cut in a direction perpendicular to a revolving link.
Figure 4:
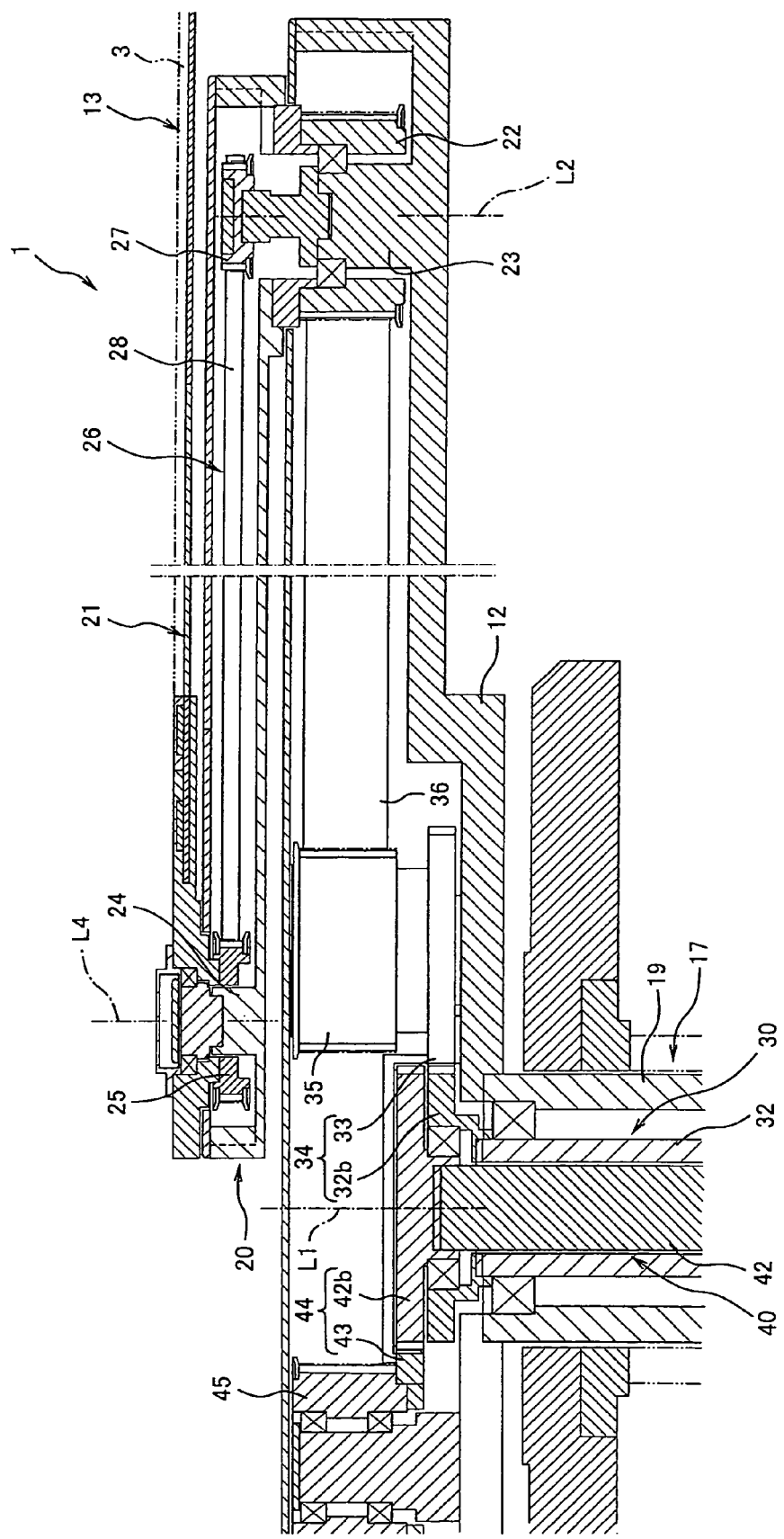
FIG. 4 is an enlarged cross-sectional view showing a cross section of major portions of the transferring apparatus of FIG. 1 when the major portions are cut in a direction parallel to the revolving link.

As shown in FIG. 2, the transferring apparatus 1 includes a fixed base 11, the revolving link 12, a first hand mechanism 13, and a second hand mechanism 14. The fixed base 11 is formed to have a substantially cylindrical shape and stands on a bottom surface portion of the transferring chamber 7. As shown in FIGS. 3 and 4, a lifting and lowering mechanism 15 and a lifting and lowering base 16 are provided in the fixed base 11. In FIGS. 3 and 4, the fixed base 11 is not shown. The lifting and lowering mechanism 15 is a so-called ball screw mechanism and includes a ball screw shaft 15a and a slider portion 15b. The ball screw shaft 15a extends in the upper-lower direction and is rotatably supported by the fixed base 11. The ball screw shaft 15a is configured to be rotated by a lifting and lowering motor, not shown. Moreover, the slider portion 15b threadedly engages with the ball screw shaft 15a, and the lifting and lowering base 16 having a cylindrical shape is integrally provided at the slider portion 15b.

A revolution drive mechanism 17 is provided at the lifting and lowering base 16. The revolution drive mechanism 17 includes a revolution motor 18 and a revolution shaft 19. As shown in FIG. 3, the revolution motor 18 is fixed to the lifting and lowering base 16 in the lifting and lowering base 16, and a driving gear 18b is attached to an output shaft 18a of the revolution motor 18. A driven gear 19a attached to the revolution shaft 19 meshes with the driving gear 18b. The revolution shaft 19 is provided at the lifting and lowering base 16 so as to be rotatable about a revolution axis L1 extending in the upper-lower direction. The revolution shaft 19 extends upwardly so as to penetrate through the lifting and lowering base 16. The driven gear 19a is attached to a lower end of the revolution shaft 19, and the revolving link 12 is fixed to an upper end thereof. The revolution shaft 19 is formed to have a tubular shape.

The revolving link 12 is a hollow plate-shaped member and is formed to have a substantially strip shape in plan view. The revolving link 12 is formed symmetrically and is fixed to the upper end of the revolution shaft 19 such that the center thereof coincides with an axis of the revolution shaft 19. The first hand mechanism 13 and the second hand mechanism 14 are symmetrically provided at both left and right end portions of the revolving link 12, respectively. The first hand mechanism 13 and the second hand mechanism 14 are the same in configuration and the like as each other except that positions thereof are different from each other. Hereinafter, only the first hand mechanism 13 provided at the right end portion of the revolving link 12 will be explained. The same reference signs as components of the first hand mechanism 13 are attached to components of the second hand mechanism 14 provided at the left end portion of the revolving link 12, and an explanation of the second hand mechanism 14 is omitted.

As shown in FIGS. 1 and 2, the first hand mechanism 13 includes an arm 20 and a hand 21. The arm 20 is a hollow plate-shaped member and is formed to have a substantially strip shape in plan view. As shown in FIG. 4, a cylindrical arm pulley 22 is fixed to a bottom surface of one longitudinal end portion (right end portion in FIG. 4) of the arm 20. Rotating shafts 23 extending upwardly are respectively formed on both left and right sides in the revolving link 12. The arm pulley 22 is rotatably attached to the rotating shaft 23. The arm 20 attached to the revolving link 12 is configured to be rotatable about a rotation axis L2 (rotation axis L3 in the second hand mechanism 14) which is an axis of the rotating shaft 23 and extends in the upper-lower direction. The hand 21 is attached to the other longitudinal end portion (left end portion in FIG. 4) of the arm 20 configured as above.

The hand 21 is a plate-shaped member. A tip end of the hand 21 is formed to have a bifurcated shape. The wafer 3 can be mounted on the tip end of the hand 21, and the hand 21 can hold the wafer 3. Moreover, a cylindrical hand pulley 25 is fixed to a bottom surface of a base end of the hand 21. A hand shaft 24 extending upwardly is formed at the other longitudinal end (left end in FIG. 4) in the arm 20, and the hand pulley 25 is rotatably attached to the hand shaft 24. The hand 21 attached to the arm 20 is configured to be rotatable about a hand axis L4 (hand axis L5 in the second hand mechanism 14) which is an axis of the hand shaft 24 and extends in the upper-lower direction.

The first hand mechanism 13 includes an interlock mechanism 26 configured to cause the hand 21 and the arm 20 to operate in conjunction with each other. The interlock mechanism 26 is constituted by the hand pulley 25, a rotating shaft pulley 27, and a hand belt 28. The rotating shaft pulley 27 is fixed to the rotating shaft 23 such that an axis thereof coincides with the rotation axis L2. The hand belt 28 winds on the rotating shaft pulley 27. The hand belt 28 also winds on the hand pulley 25. To be specific, the hand belt 28 hangs between the rotating shaft pulley 27 and the hand pulley 25.

Figure 5:
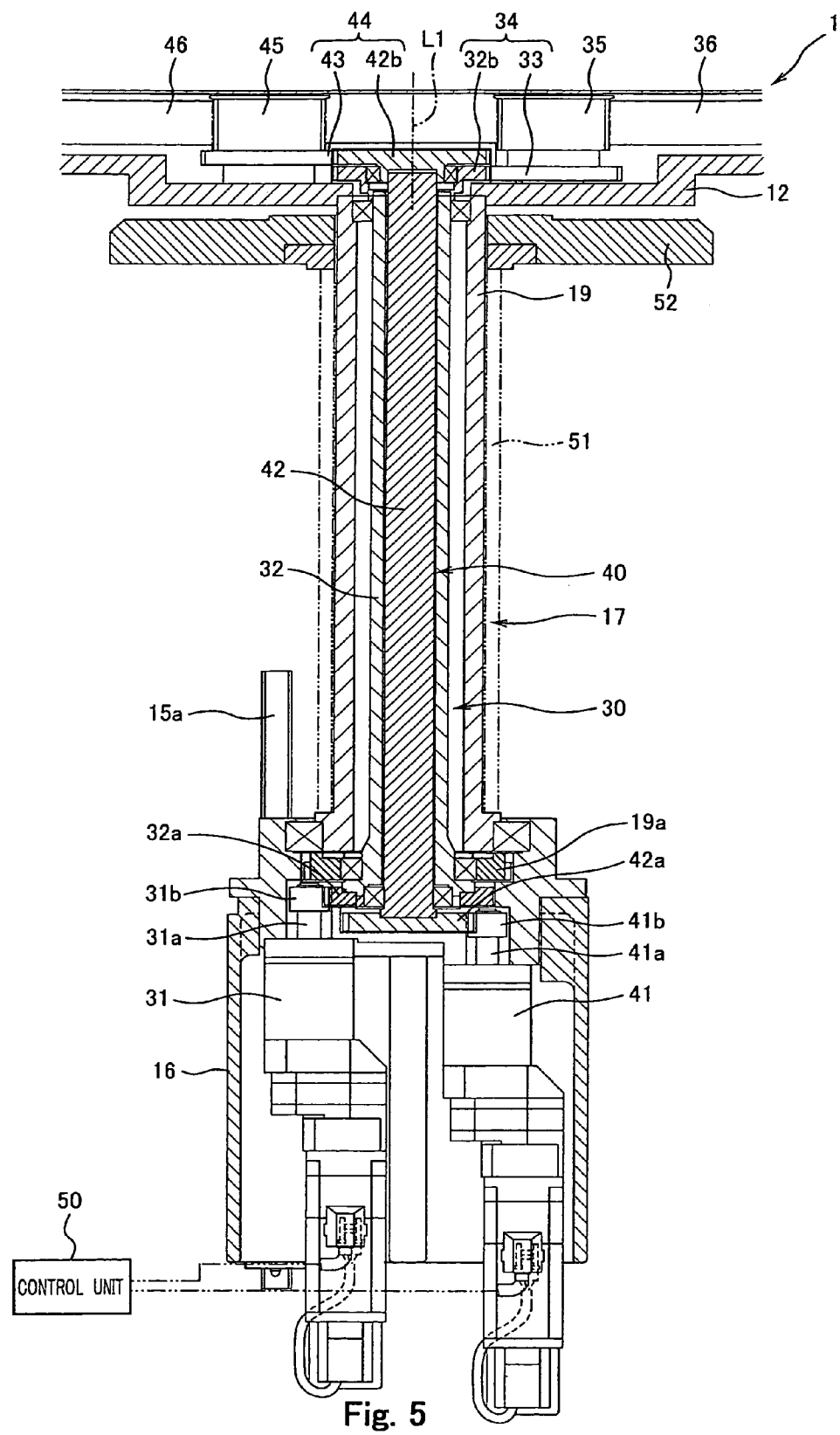
FIG. 5 is an enlarged cross-sectional view showing a cutting surface spreading in a direction parallel to the revolving link, the cutting surface being obtained by partially breaking the transferring apparatus shown in FIG. 3.

A first hand drive mechanism 30 is provided at the lifting and lowering base 16 to drive the first hand mechanism 13 configured as above. As shown in FIG. 5, the first hand drive mechanism 30 includes a first rotation motor 31 and a first driving shaft 32. As shown in FIG. 5, the first rotation motor 31 is fixed to the lifting and lowering base 16 in the lifting and lowering base 16. A driving gear 31b is attached to an output shaft 31a of the first rotation motor 31. A driven gear 32a attached to the first driving shaft 32 meshes with the driving gear 31b. The first driving shaft 32 is inserted through the revolution shaft 19 formed to have a tubular shape as described above, and a lower end and upper end thereof respectively project upwardly and downwardly from the revolution shaft 19. The lower end of the first driving shaft 32 is supported by the lifting and lowering base 16 so as to be rotatable about the revolution axis L1 (to be specific, so as to be coaxial with a revolution shaft 10). The driven gear 32a is attached to the lower end of the first driving shaft 32. The upper end of the first driving shaft 32 is rotatably supported by the revolution shaft 19. A first transmission gear 32b is attached to the upper end of the first driving shaft 32. Moreover, the first driving shaft 32 is formed to have a tubular shape.

The first transmission gear 32b is formed to have an annular thin plate shape. The first transmission gear 32b is arranged in the revolving link 12 so as to rotate about the revolution axis L1. The first transmission gear 32b meshes with a first intermediate gear 33. The first intermediate gear 33 is formed to have a thin plate shape as with the first transmission gear 32b and is rotatably provided in the revolving link 12. The first intermediate gear 33 and the first transmission gear 32b are lined up in the longitudinal direction of the revolving link 12 and constitute a first gear train 34. A first intermediate pulley 35 is fixed to an upper portion of the first intermediate gear 33. An arm belt 36 winds on the first intermediate pulley 35. The arm belt 36 also winds on the arm pulley 22. To be specific, the arm belt 36 hangs between the first intermediate pulley 35 and the arm pulley 22.

A second hand drive mechanism 40 is provided at the lifting and lowering base 16 to drive the second hand mechanism 14. As shown in FIG. 5, the second hand drive mechanism 40 includes a second rotation motor 41 and a second driving shaft 42. As shown in FIG. 5, the second rotation motor 41 is fixed to the lifting and lowering base 16 in the lifting and lowering base 16. A driving gear 41b is attached to an output shaft 41a of the second rotation motor 41. A driven gear 42a attached to the second driving shaft 42 meshes with the driving gear 41b. The second driving shaft 42 is inserted through the first driving shaft 32 formed to have a tubular shape as described above, and a lower end and upper end thereof respectively project upwardly and downwardly from the first driving shaft 32. The lower end of the second driving shaft 42 is supported by the lifting and lowering base 16 so as to be rotatable about the revolution axis L1 (to be specific, so as to be coaxial with the first driving shaft 32 and the revolution shaft 19). The driven gear 42a is attached to the lower end of the second driving shaft 42. The upper end of the second driving shaft 42 is rotatably supported by the first driving shaft 32 and further penetrates through the first transmission gear 32b. A second transmission gear 42b is attached to the upper end of the second driving shaft 42.

The second transmission gear 42b is formed to have a thin plate shape. The second transmission gear 42b is arranged in the revolving link 12 so as to overlap the first transmission gear 32b in plan view. The second transmission gear 42b is configured to rotate about the revolution axis L1. The second transmission gear 42b meshes with a second intermediate gear 43. The second intermediate gear 43 is formed to have a thin plate shape as with the second transmission gear 42b and is rotatably provided in the revolving link 12. The second intermediate gear 43, the second transmission gear 42b, and the second intermediate gear 43 are lined up in the longitudinal direction of the revolving link 12 in plan view. The second intermediate gear 43 is arranged on an opposite side of the first intermediate gear 33 with the second transmission gear 42b therebetween. The second intermediate gear 43 and the second transmission gear 42b constitute a second gear train 44. Moreover, a second intermediate pulley 45 is fixed to an upper portion of the second intermediate gear 43. An arm belt 46 winds on the second intermediate pulley 45. The arm belt 46 also winds on the arm pulley 22. To be specific, the arm belt 46 hangs between the second intermediate pulley 45 and the arm pulley 22. The second intermediate pulley 45 on which the arm belt 46 hangs is disposed so as to be the same in height as the first intermediate pulley 35.

Moreover, the transferring apparatus 1 includes an accordion bellows 51 configured to cover the revolution shaft 19, the first driving shaft 32, and the second driving shaft 42 to isolate these shafts from outside. The bellows 51 is formed to have a substantially cylindrical shape. The revolution shaft 19, the first driving shaft 32, and the second driving shaft 42 are inserted through the bellows 51. A lower end portion of the bellows 51 is hermetically attached to the lifting and lowering base 16. A flange portion 52 is provided at an upper end portion of the bellows 51. The flange portion 52 is formed to have a substantially circular plate shape. The revolution shaft 19, the first driving shaft 32, and the second driving shaft 42 penetrate through the flange portion 52. The flange portion 52 is positioned on an upper end side of the revolution shaft 19 and is opposed to the revolving link 12.

Figure 6:
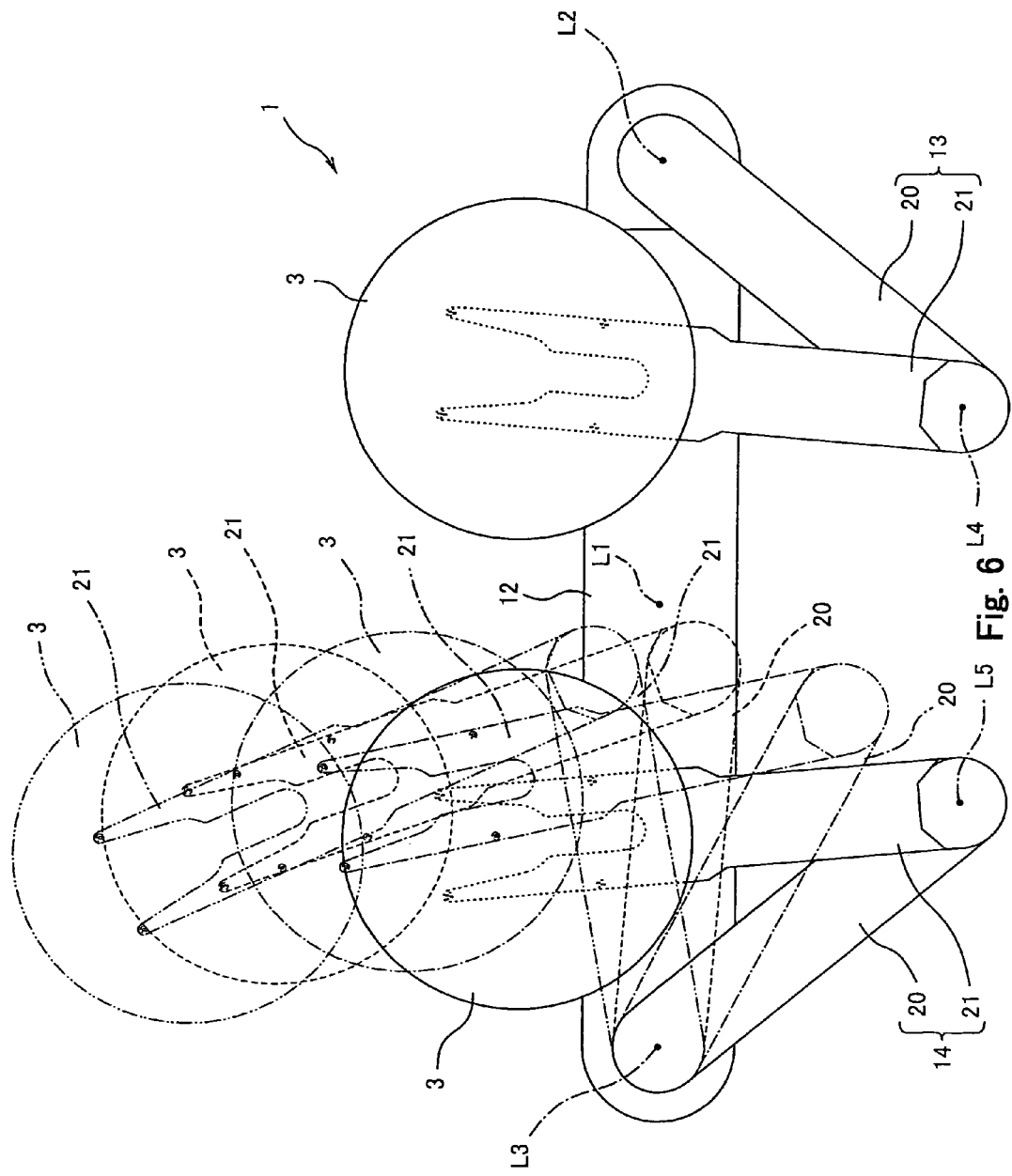
FIG. 6 is a plan view showing operations of a second hand mechanism.
Figure 7:
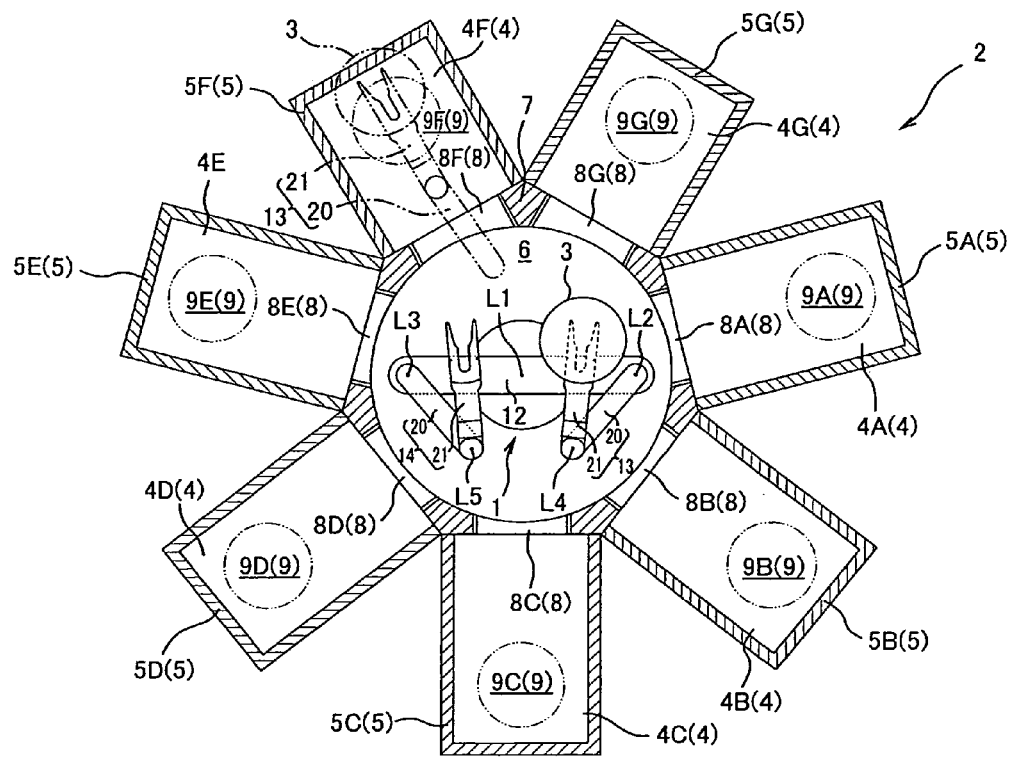
FIG. 7 is a plan view showing the transferring apparatus in an initial posture before a wafer is transferred by a first hand mechanism to a mounting position eccentrically arranged in the semiconductor processing equipment.
Figure 8:
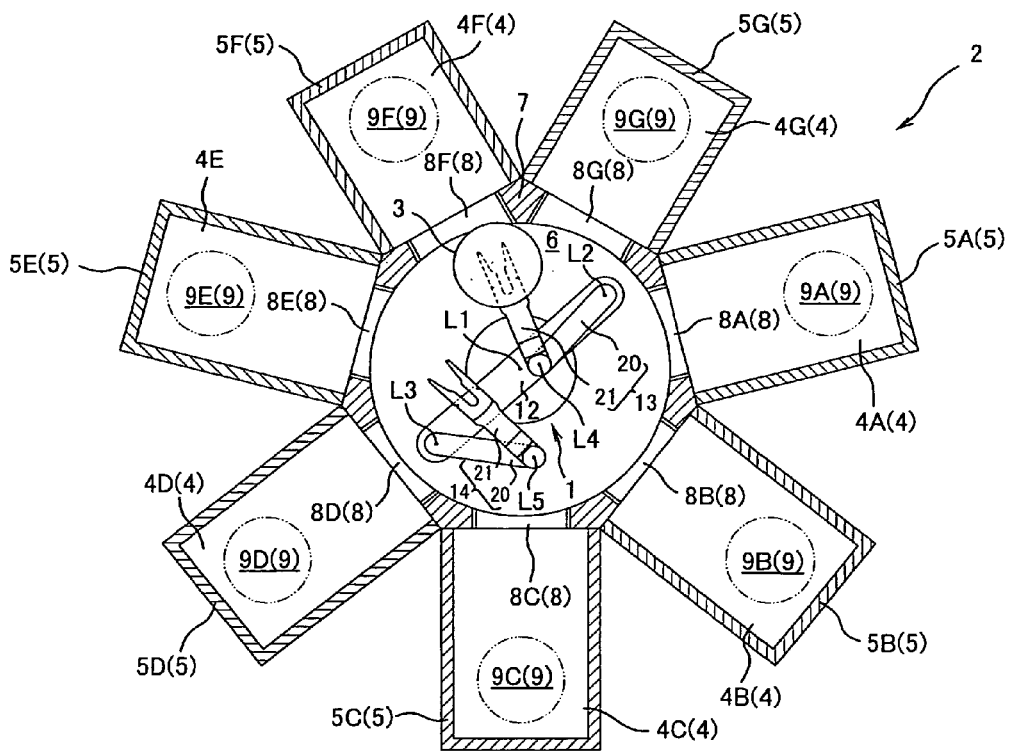
FIG. 8 is a plan view showing the transferring apparatus when the first hand mechanism is extended from the state of FIG. 7 and a hand is moved closer to a gate.
Figure 9:
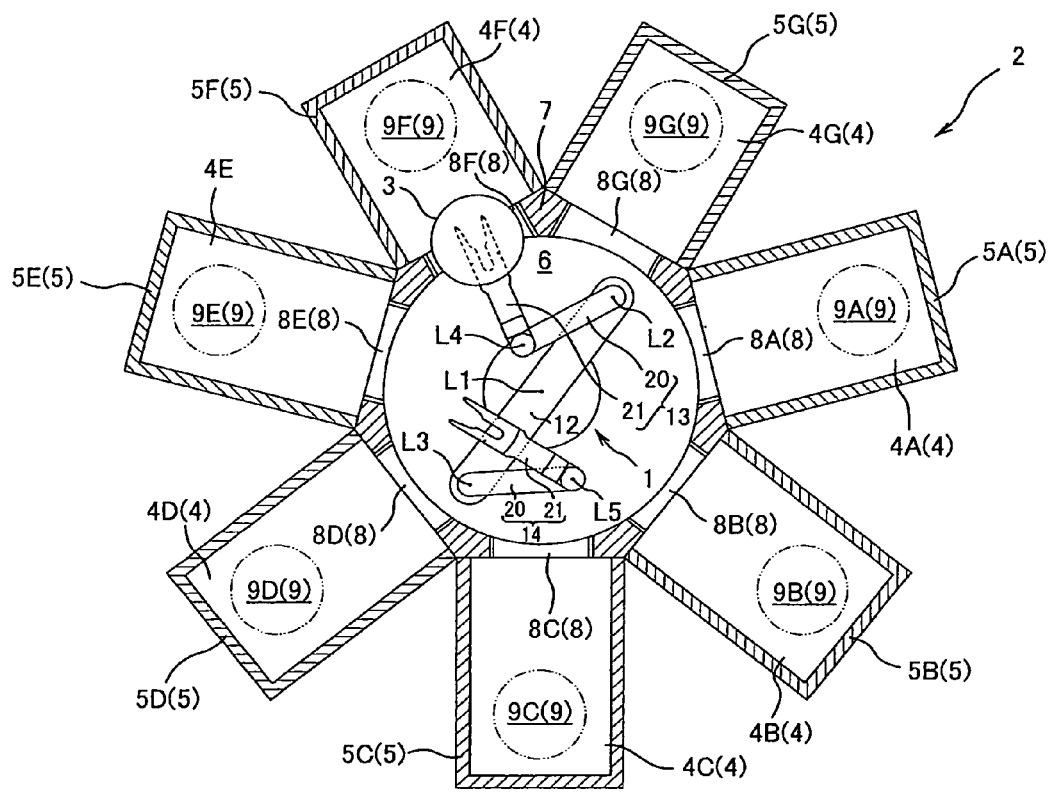
FIG. 9 is a plan view showing the transferring apparatus when the first hand mechanism is further extended from the state of FIG. 8 and the hand is inserted into the gate.
Figure 10:
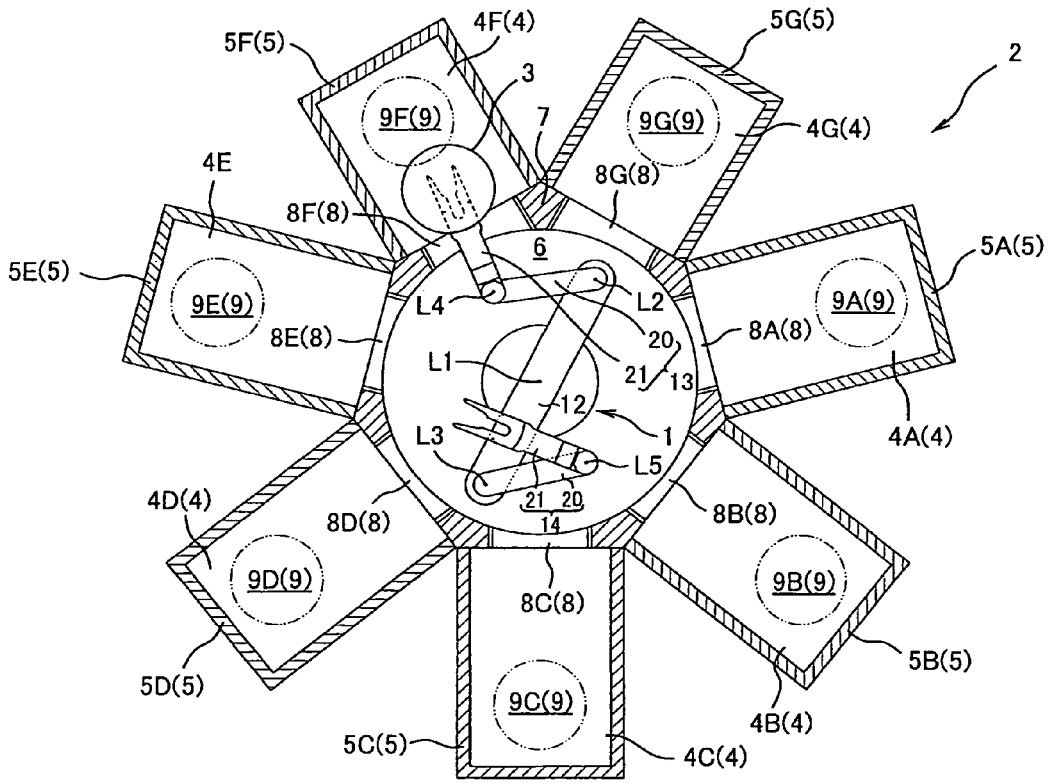
FIG. 10 is a plan view showing the transferring apparatus when the first hand mechanism is further extended from the state of FIG. 9 and the hand is inserted into a chamber.
Figure 11:
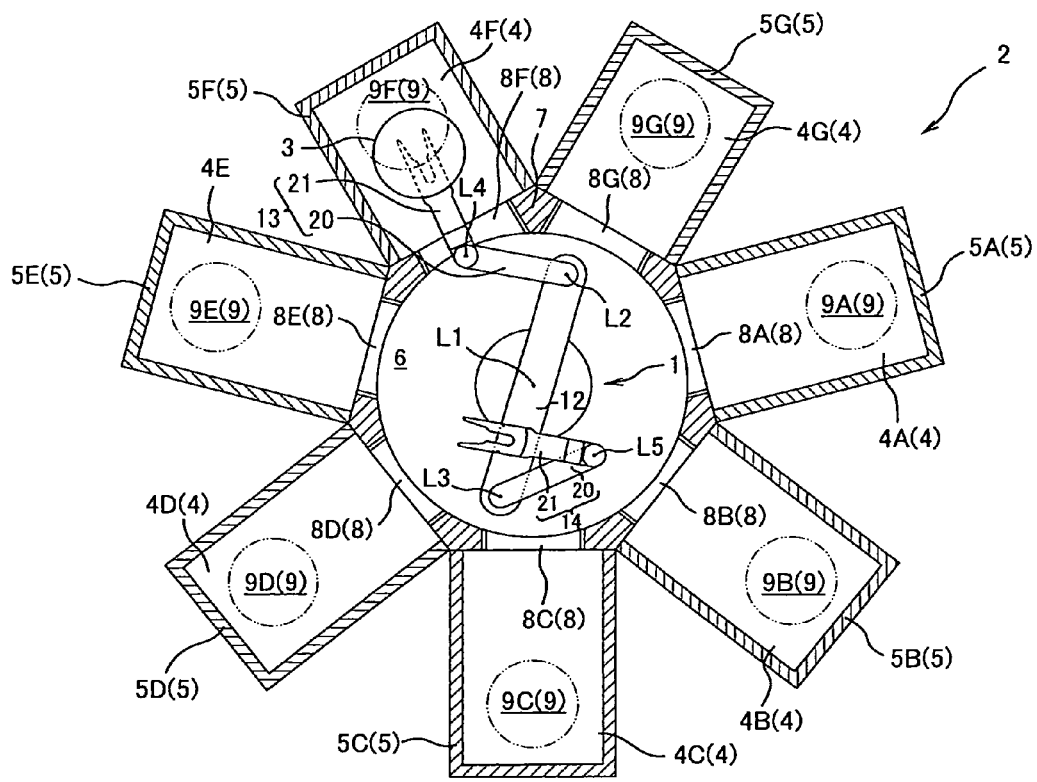
FIG. 11 is a plan view showing the transferring apparatus when the first hand mechanism is further extended from the state of FIG. 10 and the hand is moved up to the vicinity of the mounting position.
Figure 12:
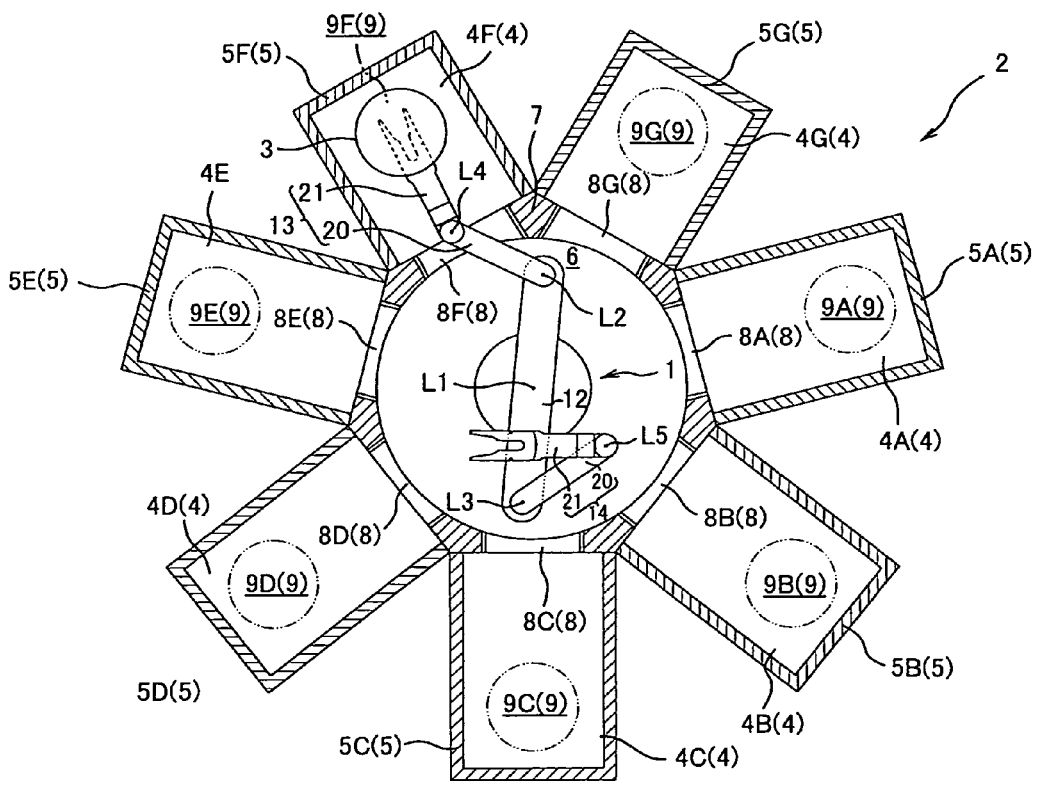
FIG. 12 is a plan view showing the transferring apparatus when the first hand mechanism is further extended from the state of FIG. 11 and the hand is moved up to the mounting position.

The first hand mechanism 13 and the second hand mechanism 14 configured as above take the initial postures shown by solid lines in FIG. 6. In the initial posture, each of the first hand mechanism 13 and the second hand mechanism 14 bends at a sharp angle, and tip ends of the hands 21 face in the substantially same direction (front direction): In each of the first hand mechanism 13 and the second hand mechanism 14 which bend as above, the arms 20 extend in an obliquely rear direction, and the hands 21 extending in the front direction therefrom are substantially parallel to each other and are substantially perpendicular to the revolving link 12 extending in the left-right direction. In the first hand mechanism 13 and the second hand mechanism 14 configured as above, the lengths of the arms 20 are determined such that the wafers 3 held by the hands 21 do not contact each other. The length of the arm 20 is set depending on the mounting position 9 on which the wafer 3 is mounted and is half the length of the revolving link 12 or shorter.

The first rotation motor 31 configured to drive the first hand mechanism 13, the second rotation motor 41 configured to drive the second hand mechanism 14, and the revolution motor 18 configured to drive the revolving link 12 are connected to a control unit 50 via a control wire. The control unit 50 that is a controller controls the revolution motor 18, the first rotation motor 31, and the second rotation motor 41 based on a predetermined program. Moreover, the control unit 50 is connected to a lifting and lowering motor, not shown, via the control wire. The control unit 50 controls the lifting and lowering motor to lift and lower the lifting and lowering base 16. Further, the control unit 50 controls the first rotation motor 31 and the second rotation motor 41 such that the arms 20 of the first hand mechanism 13 and second hand mechanism 14 are prevented from rotating rearward from the initial posture. Instead of the control unit 50, the limitation of such rotation may be performed mechanically by providing a rotation limitation pin or the like. Hereinafter, the operations of the transferring apparatus 1 when the control unit 50 controls the operations of the first hand mechanism 13 will be explained.

Operations of Transferring Apparatus

In the transferring apparatus 1, when the control unit 50 operates the first rotation motor 31 to rotate the first driving shaft 32 from an initial position, the first intermediate pulley 35 rotates via the first gear train 34. Since the first intermediate pulley 35 rotates, the arm pulley 22 rotates by the arm belt 36, and the arm 20 of the first hand mechanism 13 rotates about the rotation axis L2. When the arm 20 rotates, the hand pulley 25 rotates about the rotation axis L2. When the hand pulley 25 rotates about the rotation axis L2 as above, the hand pulley 25 rotates about the hand axis L4 by the hand belt 28. This is because the rotating shaft pulley 27 is fixed to the rotating shaft 23. With this, the hand 21 of the first hand mechanism 13 rotates about the hand axis L4. As above, the hand 21 of the first hand mechanism 13 rotates in conjunction with the arm 20. The hand 21 rotates counterclockwise when the arm 20 rotates clockwise. In contrast, the hand 21 rotates clockwise when the arm 20 rotates counterclockwise. Therefore, the first hand mechanism 13 extends when the arm 20 rotates clockwise. In contrast, the first hand mechanism 13 bends when the arm 20 rotates counterclockwise.

Moreover, when the control unit 50 drives the second rotation motor 41, as with the first hand drive mechanism 30, the arm 20 of the second hand mechanism 14 rotates, and the hand 21 of the second hand mechanism 14 rotates in conjunction with the arm 20. Since the arm 20 and hand 21 of the second hand mechanism 14 rotate in conjunction with each other, the second hand mechanism 14 bends and extends.

Reduction Ratio of Rotation of Hand 21 To Rotation of Arm 20

When the first hand mechanism 13 and the second hand mechanism 14 which bend and extend as above are in the initial postures, the hands 21 and the wafers 3 held by the hands 21 do not contact each other. When the arms 20 of the hand mechanisms 13 and 14 rotate forward from such initial state, the hand 21 is moved in conjunction with the arm 21 so as to avoid the other hand mechanism 14 (or 13) as shown by dashed lines, dotted lines, and chain double-dashed lines in FIG. 6. Such avoiding operation is realized by adjusting a change gear ratio (gear ratio) between the rotating shaft pulley 27 and the hand pulley 25, that is, the reduction ratio of the hand 21 to the arm 20. The reduction ratio is set within a range of not lower than 1.35 and not higher than 1.65, and the change gear ratio (gear ratio) between the rotating shaft pulley 27 and the hand pulley 25 is set to realize such reduction ratio. By setting the reduction ratio in such range, the avoiding operation can be realized, and in addition, the hand 21 and the wafer 3 held by the hand 21 can be moved substantially linearly as described below. By moving the hand 21 linearly, the hand 21 and the wafer 3 held by the hand 21 can be prevented from interfering with the gate 8 during transferring. In the present embodiment, the change gear ratio (gear ratio) is set such that the reduction ratio becomes, for example, 1.55. Hereinafter, the movement of the hand 21 of the transferring apparatus 1 in the semiconductor processing equipment 2 will be explained in detail.

Movement of Hand in Semiconductor Processing Equipment

Hereinafter, a case where the wafer 3 is transferred to the treatment room 4F in the process chamber 5F provided on a front left side of the transferring chamber 7 will be explained in reference to FIGS. 7 to 12. First, the control unit 50 revolves the revolving link 12 of the transferring apparatus 1 in the initial posture to cause the tip end portions of the hands 21 of the first hand mechanism 13 and second hand mechanism 14 to face the treatment room 4F that is a transfer destination (see FIG. 7). At this time, the revolving link 12 extends in the left-right direction.

Next, the control unit 50 drives the revolution motor 18 to rotate the revolving link 12 counterclockwise. While rotating the revolving link 12, the control unit 50 drives the first rotation motor 31 to rotate the arm 20 and hand 21 of the first hand mechanism 13, thereby extending the first hand mechanism 13. As above, the control unit 50 extends the first hand mechanism 13 while rotating the revolving link 12, and thus, the control unit 50 moves the hand 21 and the wafer 3 toward the gate 8F connected to the treatment room 4F. At this time, the control unit 50 controls the revolution motor 18 and the first rotation motor 31 such that the hand 21 is moved substantially linearly with respect to the gate 8F (the hand 21 faces in a direction which substantially coincides with an opening direction of the gate 8F). When the hand 21 is moved closer to the gate 8F (see FIG. 8), the control unit 50 decreases the rotation speed of the revolution motor 18 while extending the first hand mechanism 13. Then, the control unit 50 inserts the wafer 3 held by the hand 21 into the gate 8F while adjusting the rotation speed (see FIG. 9). At this time, to prevent the wafer 3 from contacting the gate 8F, the hand 21 is inserted substantially linearly in the vicinity of the center of the gate 8F. After the hand 21 is inserted, the control unit 50 extends the first hand mechanism 13 while adjusting the rotation speed of the revolution motor 18 and moves the hand 21 and the wafer 3 substantially linearly toward the mounting position 9F (see FIGS. 710 to 12).

When the wafer 3 reaches the mounting position 9F of the treatment room 4F, the control unit 50 stops the revolution motor 18 and the first rotation motor 31. Further, the control unit 50 operates the lifting and lowering motor to lower the lifting and lowering base, thereby mounting the wafer 3 on the mounting position 9F. After the wafer 3 is mounted, the control unit 50 operates the revolution motor 18 and bends the first hand mechanism 13 to move back the hand 21 along a route along which the hand 21 has moved. Thus, the control unit 50 returns the transferring apparatus 1 to the initial posture.

Figure 13:
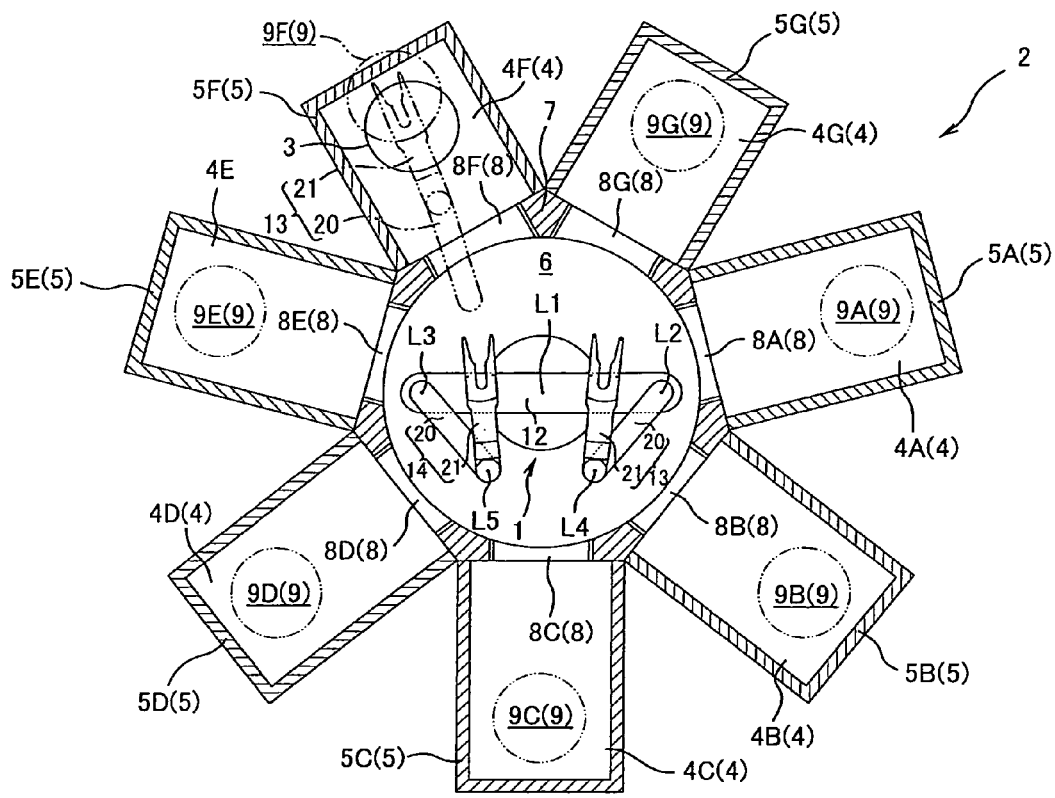
FIG. 13 is a plan view showing the transferring apparatus in the initial posture before the second hand mechanism takes the wafer disposed on the mounting position eccentrically arranged in the semiconductor processing equipment.
Figure 14:
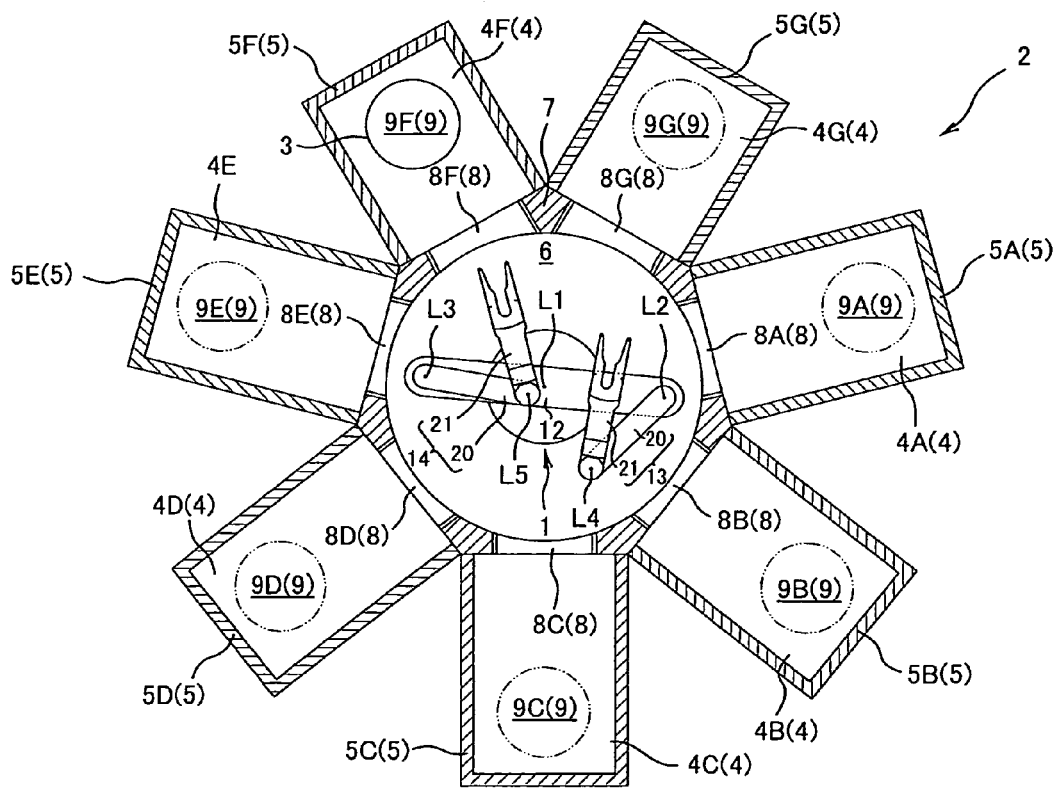
FIG. 14 is a plan view showing the transferring apparatus when the second hand mechanism is extended from the state of FIG. 13 and the hand is moved closer to the gate.
Figure 15:
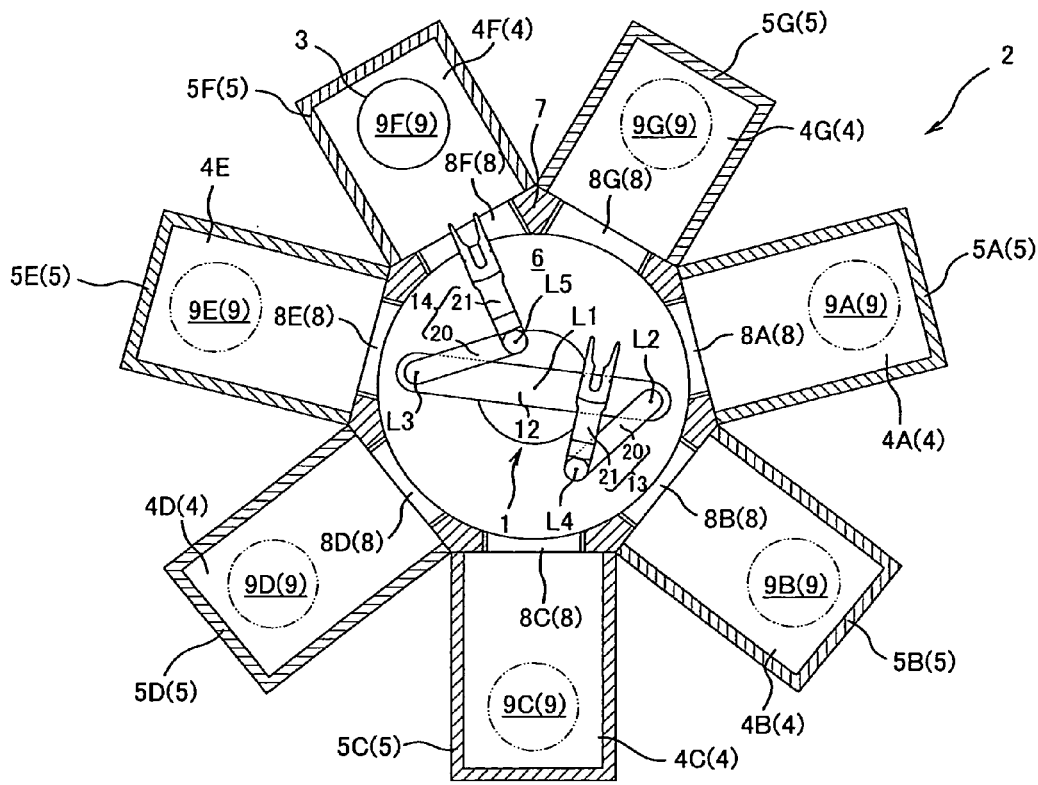
FIG. 15 is a plan view showing the transferring apparatus when the second hand mechanism is further extended from the state of FIG. 14 and the hand is inserted into the gate.
Figure 16:
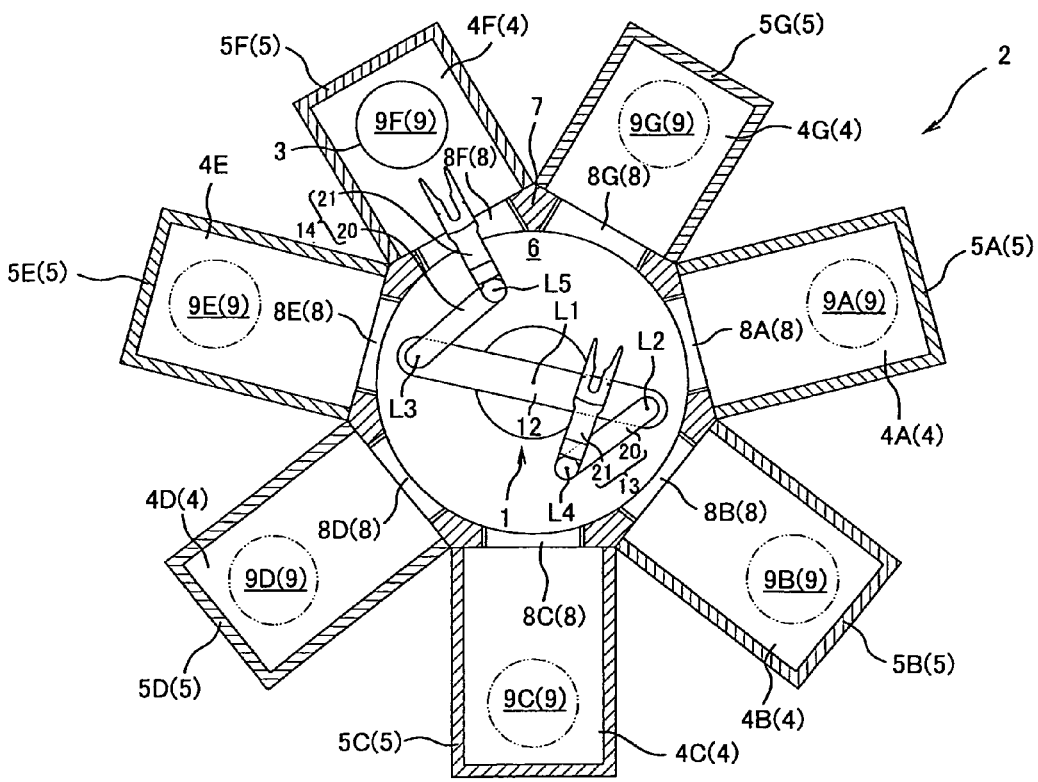
FIG. 16 is a plan view showing the transferring apparatus when the second hand mechanism is further extended from the state of FIG. 15 and the hand is inserted into the chamber.
Figure 17:
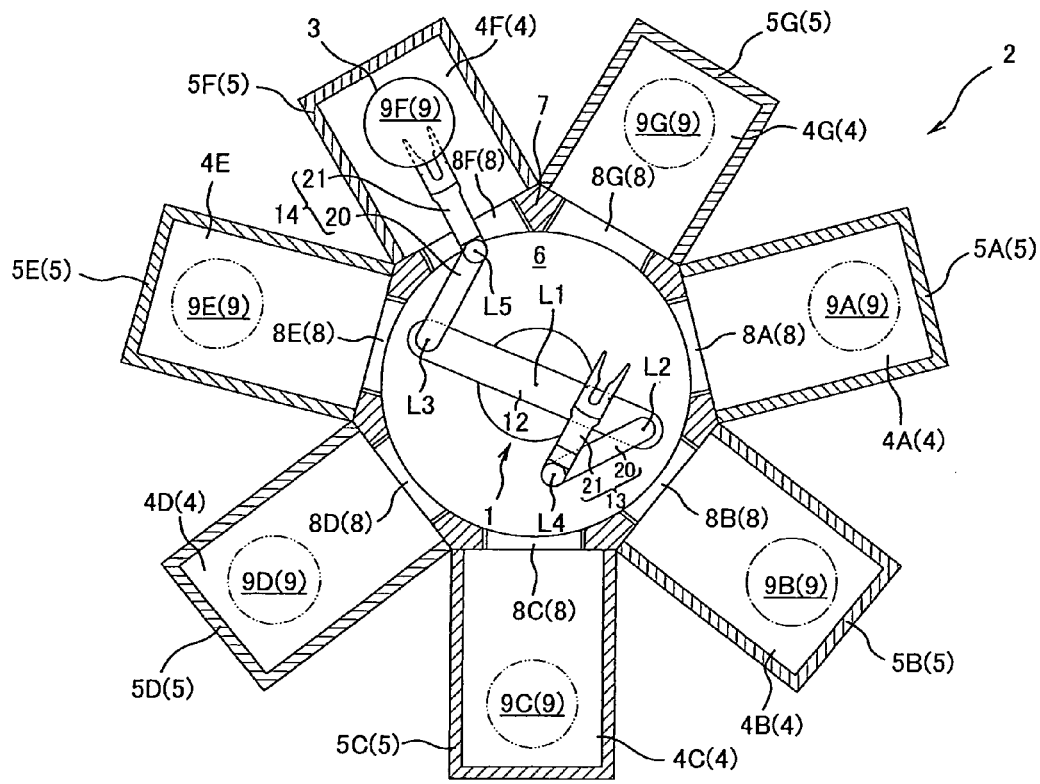
FIG. 17 is a plan view showing the transferring apparatus when the second hand mechanism is further extended from the state of FIG. 16 and the hand is moved up to the vicinity of the mounting position.
Figure 18:
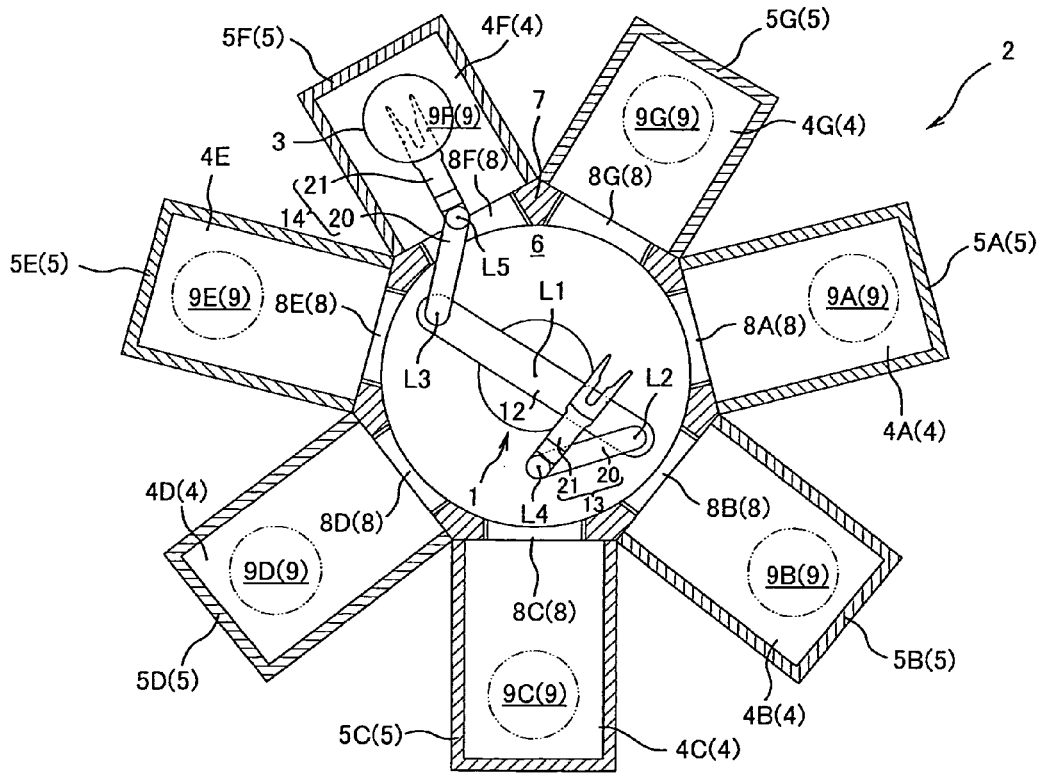
FIG. 18 is a plan view showing the transferring apparatus when the second hand mechanism is further extended from the state of FIG. 17 and the hand is moved up to the mounting position.
Figure 19:
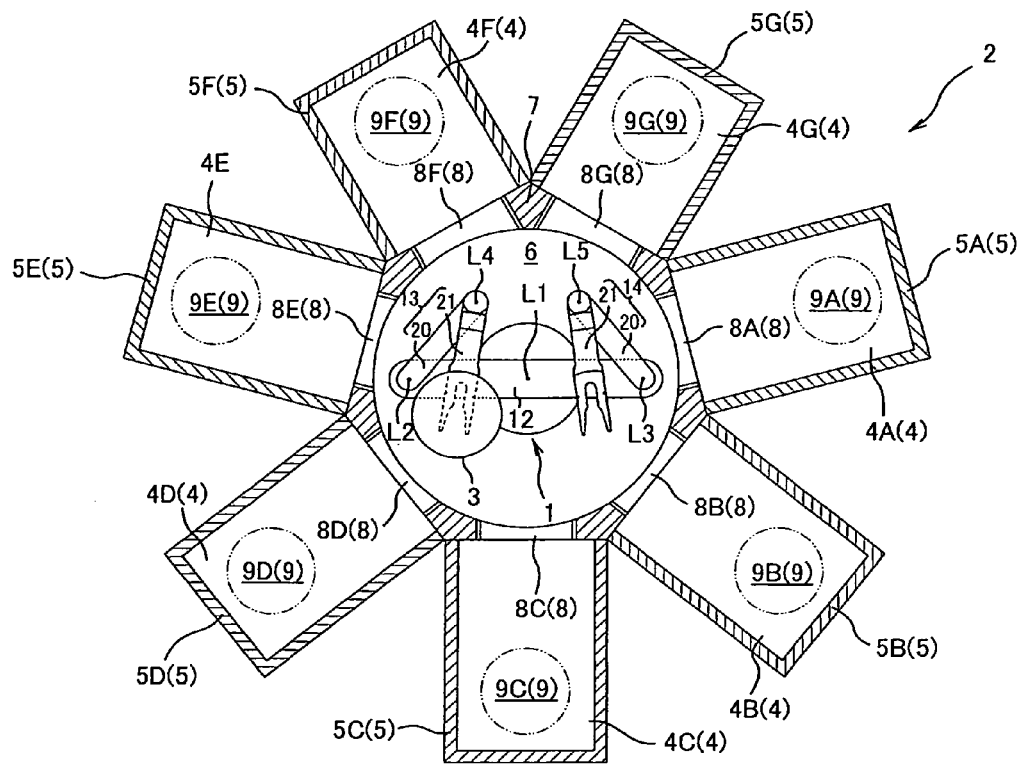
FIG. 19 is a plan view showing the transferring apparatus in the initial posture before the second hand mechanism takes the wafer mounted on the mounting position radially arranged in the semiconductor processing equipment.
Figure 20:
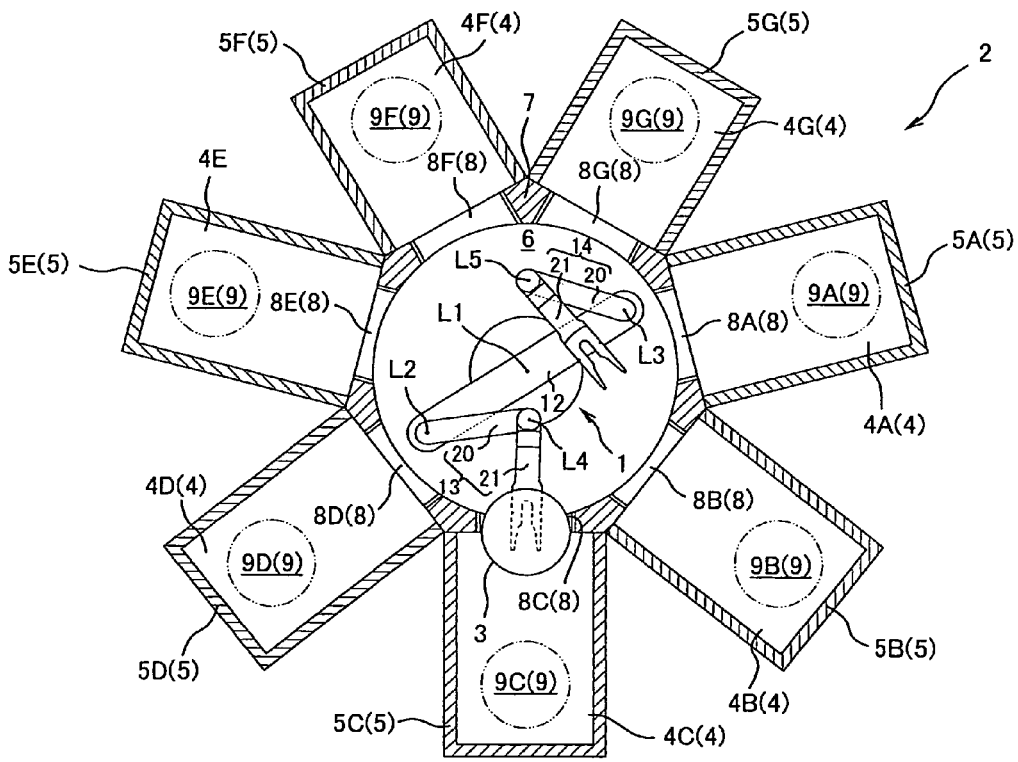
FIG. 20 is a plan view showing the transferring apparatus when the second hand mechanism is extended from the state of FIG. 19 and the hand is inserted into the gate.
Figure 21:
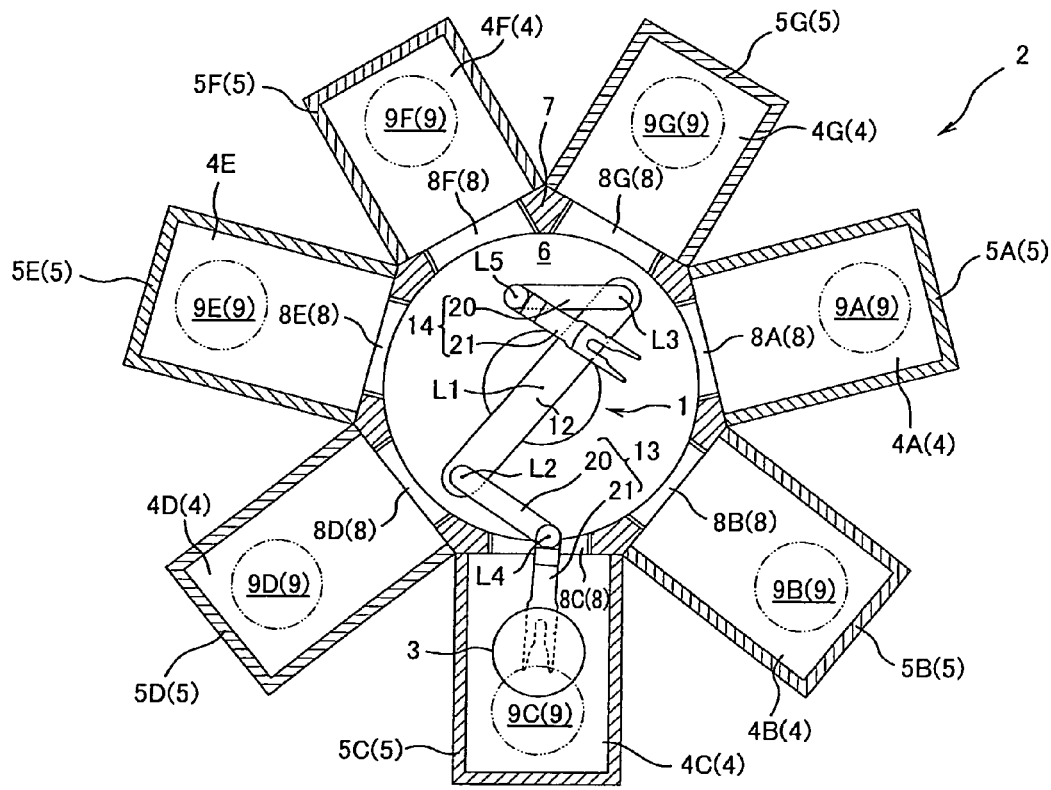
FIG. 21 is a plan view showing the transferring apparatus when the second hand mechanism is further extended from the state of FIG. 20 and the hand is moved up to the vicinity of the mounting position.
Figure 22:
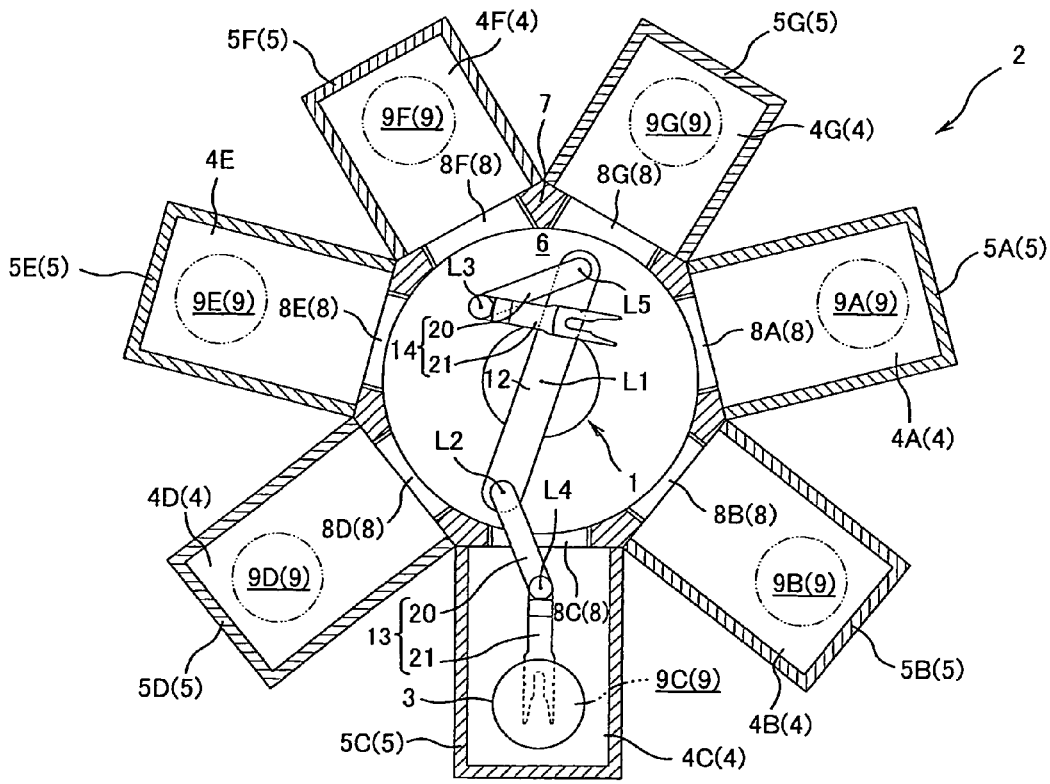
FIG. 22 is a plan view showing the transferring apparatus when the second hand mechanism is further extended from the state of FIG. 21 and the hand is moved up to the mounting position.

The wafer 3 mounted on the mounting position 9F is taken out by the hand 21 of the second hand mechanism 14. Next, a case where the second hand mechanism 14 takes out the wafer 3 from the treatment room 4F of the process chamber 5F will be explained in reference to FIGS. 13 and 18. First, the control unit 50 extends the second hand mechanism 14 while rotating clockwise the revolving link 12 of the transferring apparatus 1 (see FIG. 13) in the initial posture. With this, the hand 21 is moved toward the gate 8F connected to the treatment room 4F (see FIG. 14). Then, the control unit 50 inserts the hand 21 into the gate 8F while adjusting the rotation speed of the revolving link 12 (see FIG. 15). After the hand 21 is inserted, the control unit 50 moves the hand 21 and the wafer 3 substantially linearly along a transfer route (see FIGS. 16 to 18). Then, when the wafer 3 reaches the mounting position 9F of the treatment room 4F, the control unit 50 stops the revolution motor 18 and the first rotation motor 31 and operates the lifting and lowering motor to lift the lifting and lowering base 16, thereby holding the wafer 3 at the mounting position 9F by the hand 21. After the hand 21 holds the water 3, the control unit 50 operates the revolution motor 18 and bends the first hand mechanism 13 to move back the hand 21 along a route along which the hand 21 has moved. Thus, the control unit 50 returns the transferring apparatus 1 to the initial posture.

As above, the transferring apparatus 1 can move the hands 21 of the first hand mechanism 13 and second hand mechanism 14 substantially linearly up to the mounting position 9F arranged eccentrically. Therefore, the transferring apparatus 1 can mount the wafer 3 on the mounting position 9F and takes the wafer 3 from the mounting position 9F while preventing the first hand mechanism 13, the second hand mechanism 14, and the wafer 3 held by the first hand mechanism 13 or the second hand mechanism 14 from contacting the transferring chamber 7. Although not shown, the transferring apparatus 1 can mount the wafer 3 on the mounting position 9G arranged eccentrically as with the above and take the wafer 3 from the mounting position 9G Moreover, the transferring apparatus 1 can further move the hand 21 substantially linearly toward a far side of the mounting position 9F (see chain double-dashed lines in FIGS. 7 and 13) and move the hand 21 substantially linearly toward various positions arranged eccentrically.

Moreover, the transferring apparatus 1 can transfer the wafer 3 to not only the positions arranged eccentrically but also the mounting positions 8A to 8E arranged radially. As one example, a case where the first hand mechanism 13 transfers the wafer 3 to the mounting position 8C is shown in FIGS. 19 to 22. Control operations executed by the control unit 50 here are the same as control operations executed when the control unit 50 moves the hand 21 of the first hand mechanism 13 to the mounting position 9F except for an initial direction of the hand 21 (see FIG. 19), the amount of rotation of the revolution motor 18, and the amount of rotation of the first rotation motor 31. The hand 21 of the first hand mechanism 13 which has moved by executing such control operations is inserted substantially linearly into the gate 8C (see FIG. 20) and keeps moving substantially linearly to reach the mounting position 9C (see FIGS. 21 and 22). By changing the direction of the hand 21 before the hand 21 is inserted, the transferring apparatus 1 can move the hand 21 substantially linearly toward each of the mounting positions 9A, 9B, 9D, and 9E in the same manner as above. Therefore, the transferring apparatus 1 can move the hand 21 of the first hand mechanism 13 substantially linearly up to each of the mounting positions 9A to 9E arranged radially, mount the wafer 3 on each of the mounting positions 9A to 9E, and take the wafer 3 from each of the mounting positions 9A to 9E.

As above, the trajectory of the hand 21 of each of the hand mechanisms 13 and 14 which mounts and takes the wafer 3 can be changed by the change gear ratio (gear ratio) between the rotating shaft pulley 27 and the hand pulley 25. That is, the trajectory of the hand 21 can be adjusted depending on the reduction ratio of the arm 20 and the hand 21. The following will explain how the hand 21 of the second hand mechanism 14 is moved and the wafer 3 is transferred to the treatment room 4A in the process chamber 5A located on the right side of the transferring chamber 7 when the reduction ratio is set to each of 1.0, 1.35, 1.65, and 2.0.

Comparisons Regarding Operations by Different Reduction Ratios

Figure 23:
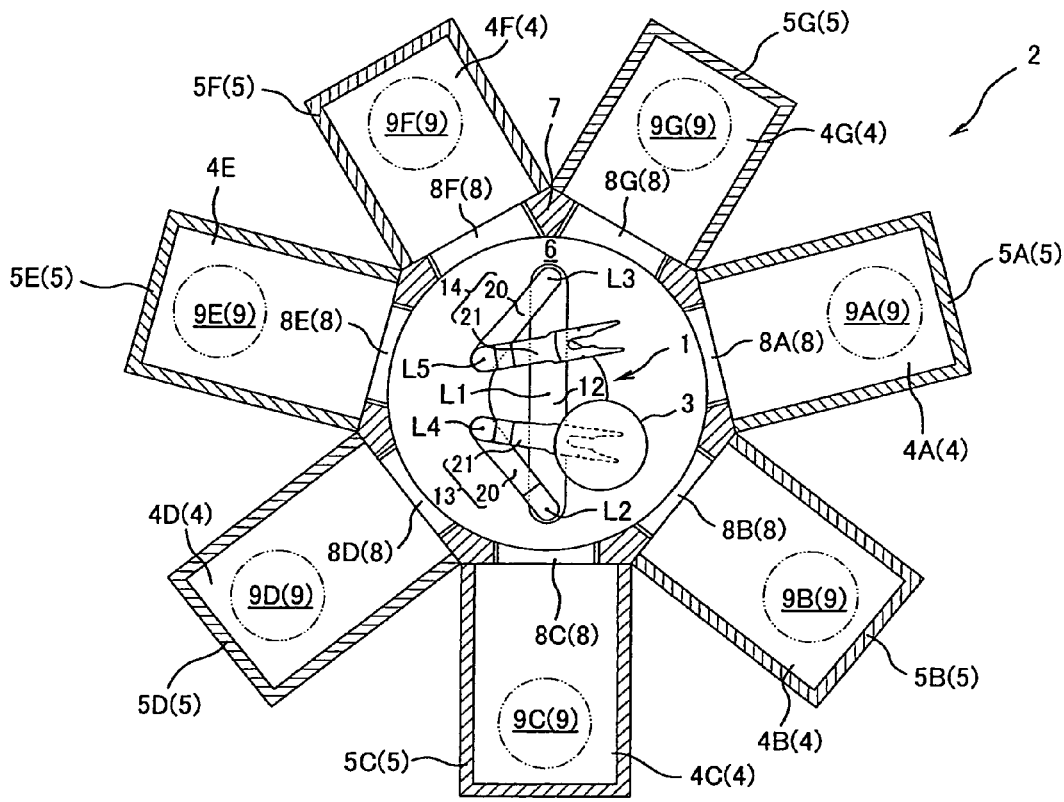
FIG. 23 is a plan view showing the transferring apparatus in the initial posture when a reduction ratio is 1.0.
Figure 24:
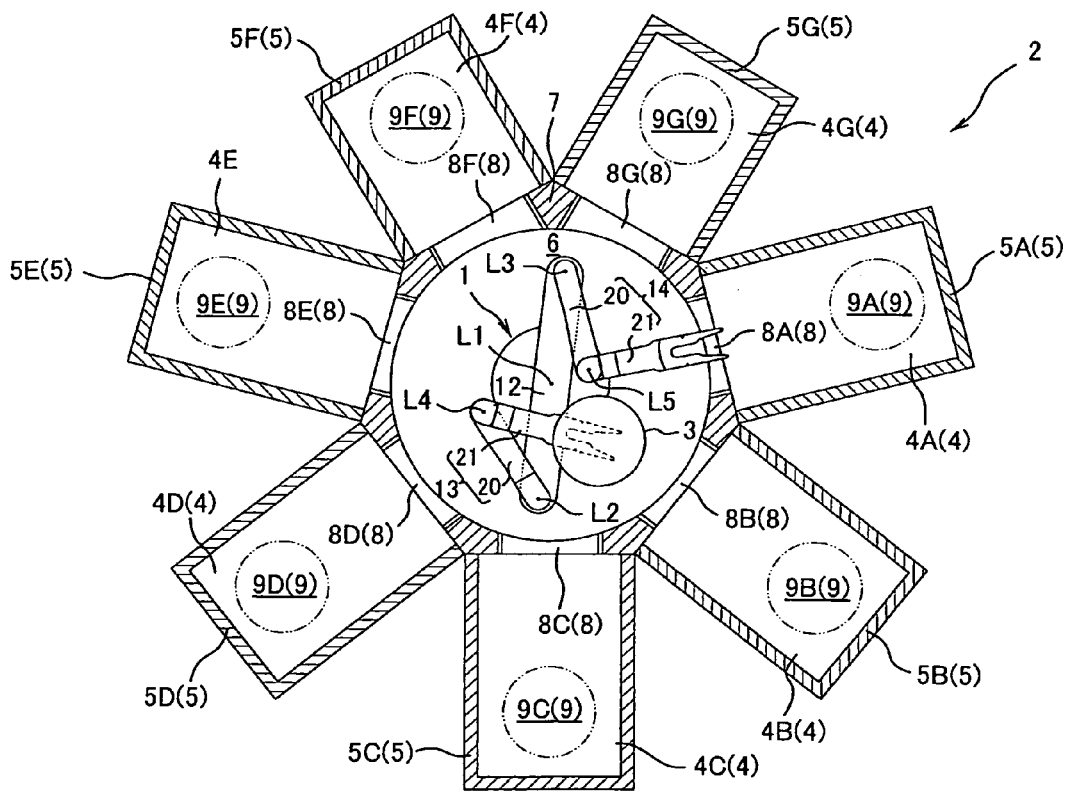
FIG. 24 is a plan view showing the transferring apparatus when the second hand mechanism is extended from the state of FIG. 23 and the hand is inserted into the gate.
Figure 25:
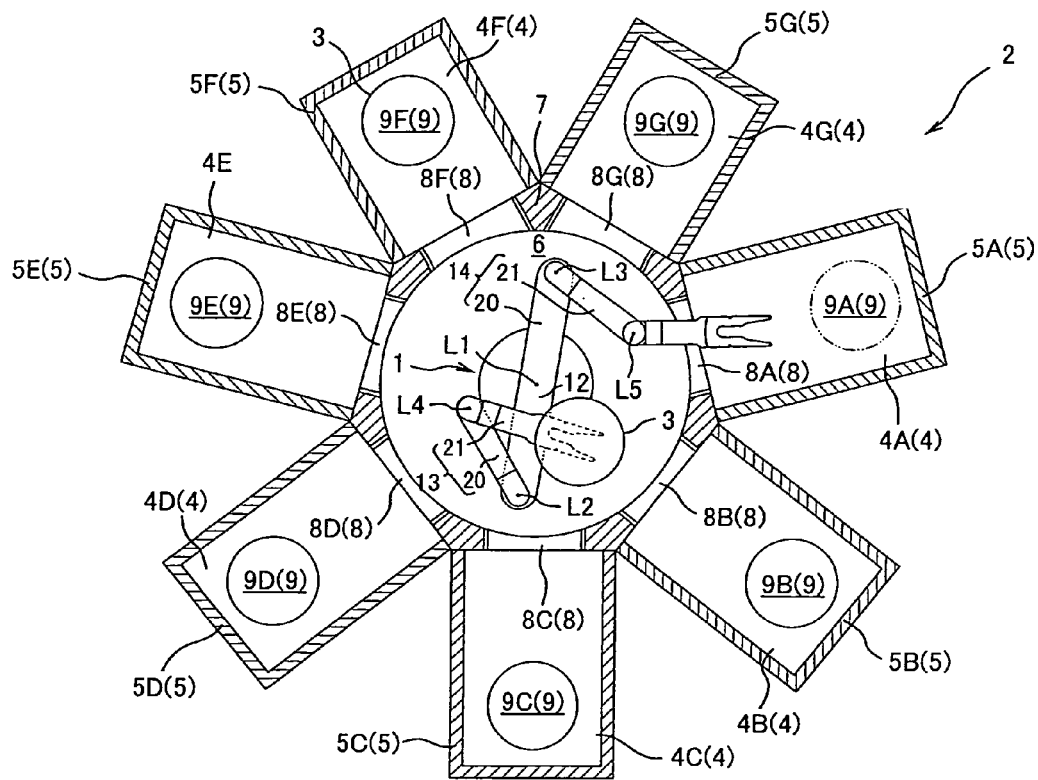
FIG. 25 is a plan view showing the transferring apparatus when the second hand mechanism is further extended from the state of FIG. 24 and the hand is moved up to the vicinity of the mounting position.
Figure 26:
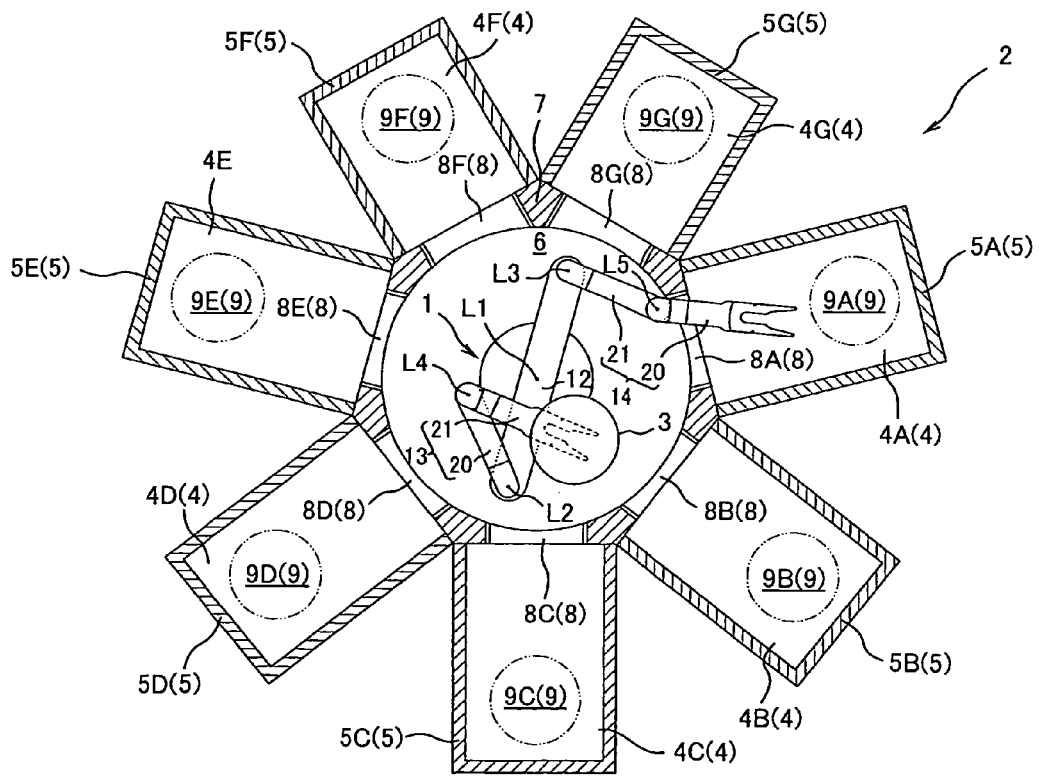
FIG. 26 is a plan view showing the transferring apparatus when the second hand mechanism is further extended from the state of FIG. 21 and the second hand mechanism contacts the chamber.

The following will explain a case where the reduction ratio is set to 1.0. First, the control unit 50 rotates the revolving link 12 of the transferring apparatus 1 in the initial posture to cause the tip end portion of the hand 21 of each of the first hand mechanism 13 and the second hand mechanism 14 to face the treatment room 4A that is the transfer destination (see FIG. 23). Then, the control unit 50 controls the revolution motor 18 and the second rotation motor 41 to insert the hand 21 of the second hand mechanism 14 into the treatment room 4A (see FIGS. 24 and 25). The hand 21 of the second hand mechanism 14 is in a substantially straight posture when it is inserted into the gate 8A. However, as the hand 21 is moved toward the mounting position 9A, the posture thereof inclines obliquely with respect to the gate 8A in plan view. When the hand 21 keeps moving forward, it contacts the transferring chamber 7 (to be precise, a left portion of the gate 8A in the opening direction) (see FIG. 26). As above, in a case where the reduction ratio is set to 1.0, the hand 21 of the second hand mechanism 14 is inserted into the gate 8A and is moved forward while the posture thereof inclines. Therefore, the hand 21 contacts the transferring chamber 7.

Figure 27:
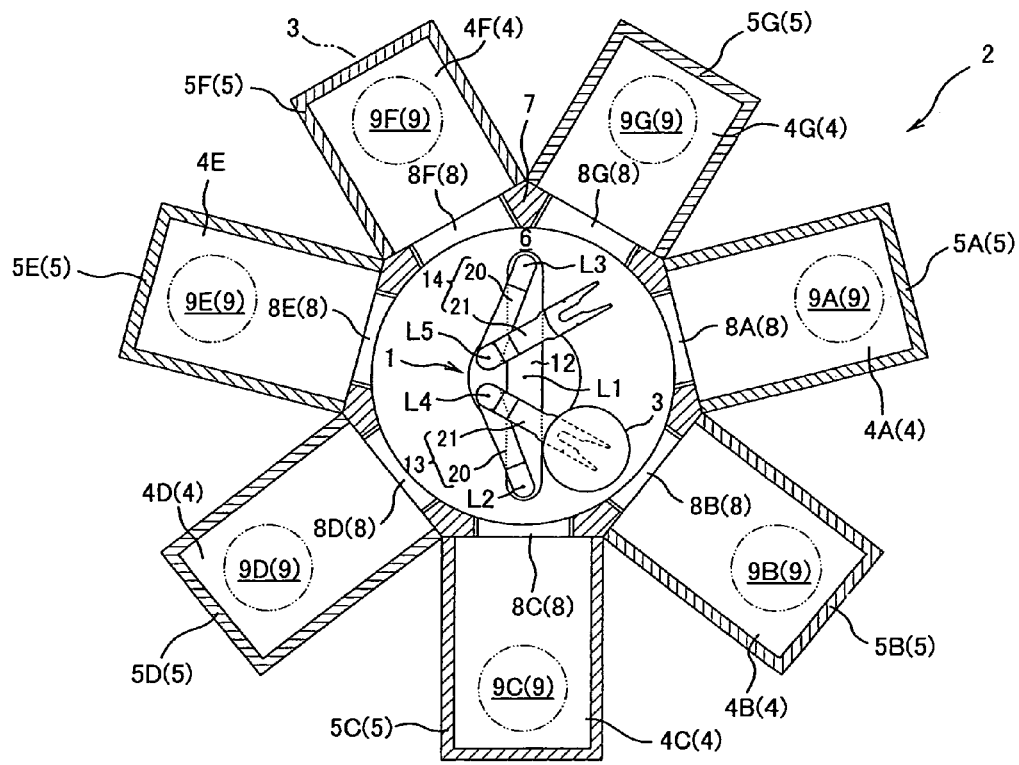
FIG. 27 is a plan view showing the transferring apparatus in the initial posture when the reduction ratio is 1.35.
Figure 28:
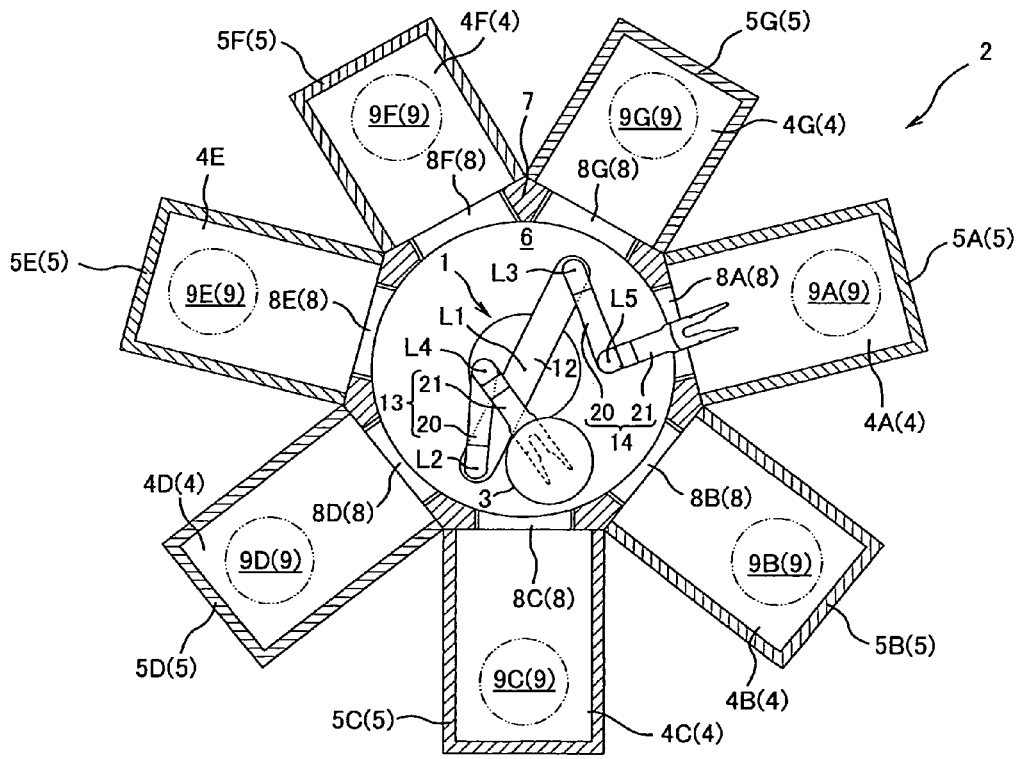
FIG. 28 is a plan view showing the transferring apparatus when the second hand mechanism is extended from the state of FIG. 27 and the hand is inserted into the gate.
Figure 29:
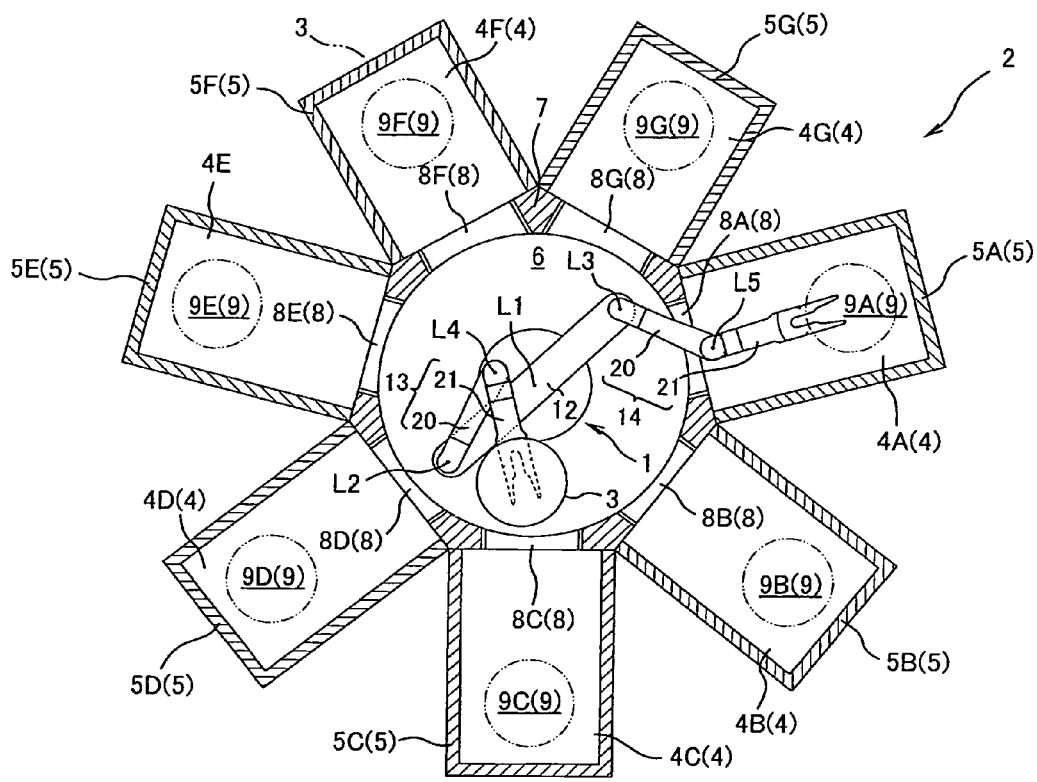
FIG. 29 is a plan view showing the transferring apparatus when the second hand mechanism is further extended from the state of FIG. 28 and the hand is moved up to the vicinity of the mounting position.
Figure 30:
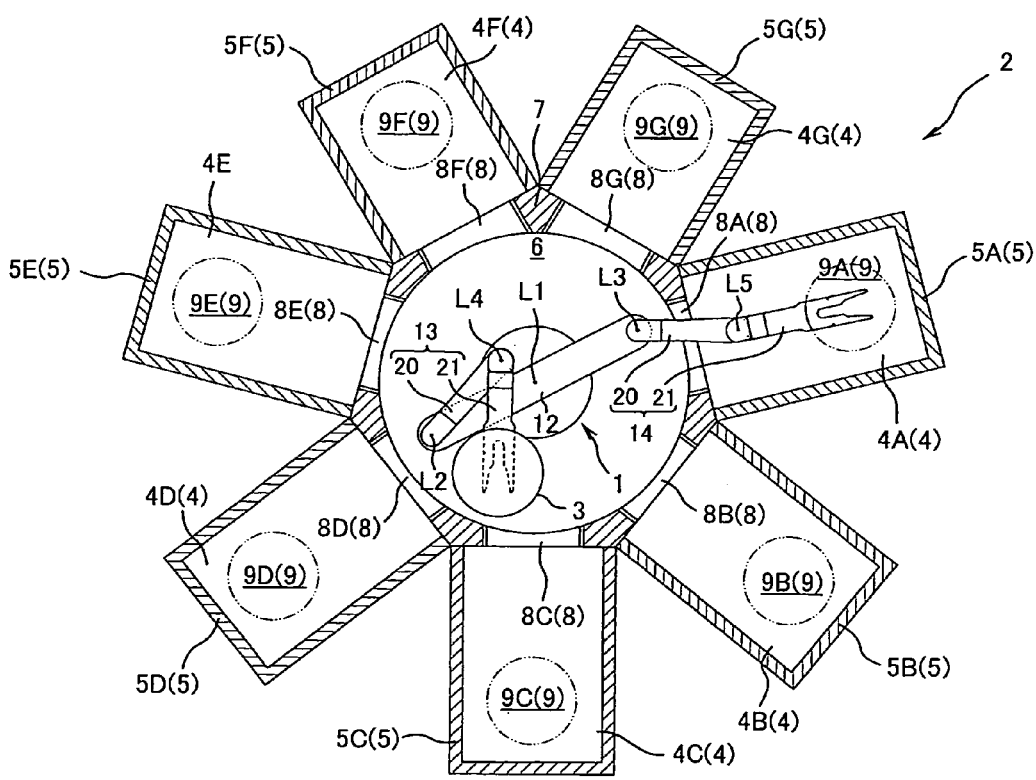
FIG. 30 is a plan view showing the transferring apparatus when the second hand mechanism is further extended from the state of FIG. 29 and the hand is moved up to the mounting position.

Next, a case where the reduction ratio is set to 1.35 will be explained. The control unit 50 carries out the same control operations as a case where the reduction ratio is set to 1.0, and inserts the hand 21 of the second hand mechanism 14 into the treatment room 4A (see FIGS. 27 and 28). The hand 21 of the second hand mechanism 14 inserted into the gate 8A is moved substantially linearly with respect to the gate 8A when and after it is inserted into the gate 8A (see FIG. 29). Therefore, the hand 21 of the second hand mechanism 14 can be moved to the mounting position 9A while preventing the arm 20, the hand 21, and the wafer 3 held by the hand 21 from contacting the transferring chamber 7 or the process chamber 5A (see FIG. 30). As above, when the reduction ratio is set to 1.35, the hand 21 of the second hand mechanism 14 can be moved substantially linearly with respect to the gate 8A, and the hand 21, the arm 20, and the wafer 3 can be prevented from contacting the transferring chamber 7.

Figure 31:
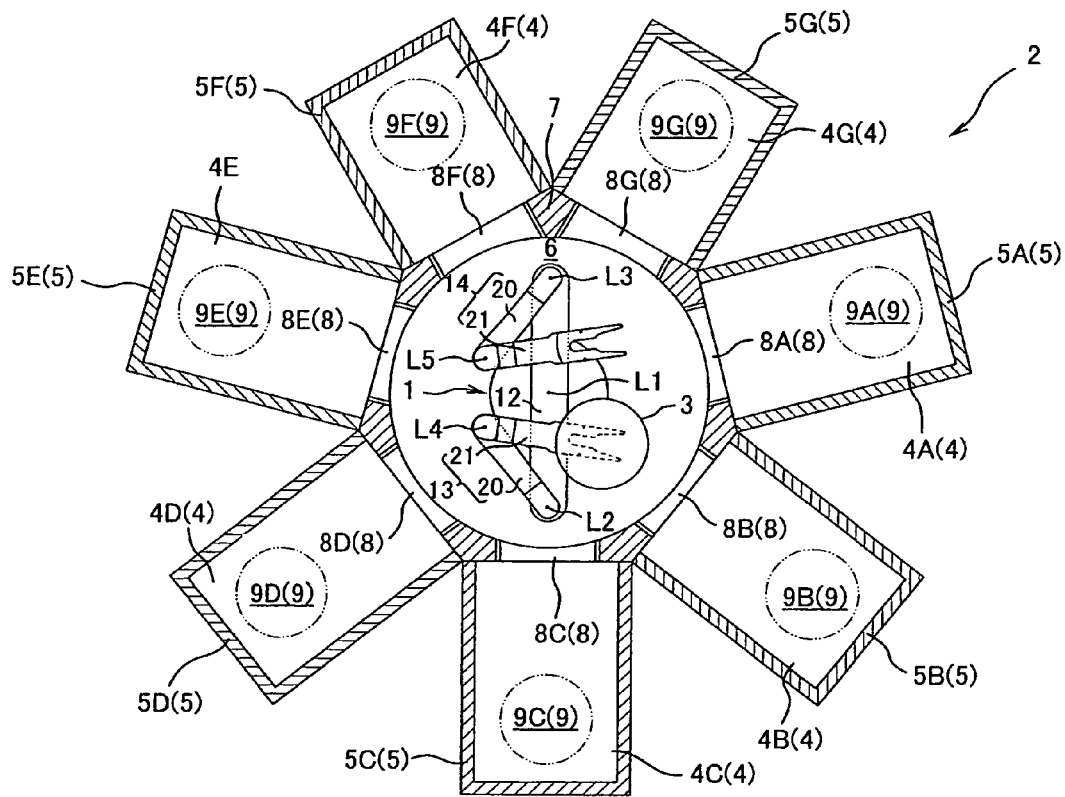
FIG. 31 is a plan view showing the transferring apparatus in the initial posture when the reduction ratio is 1.65.
Figure 32:
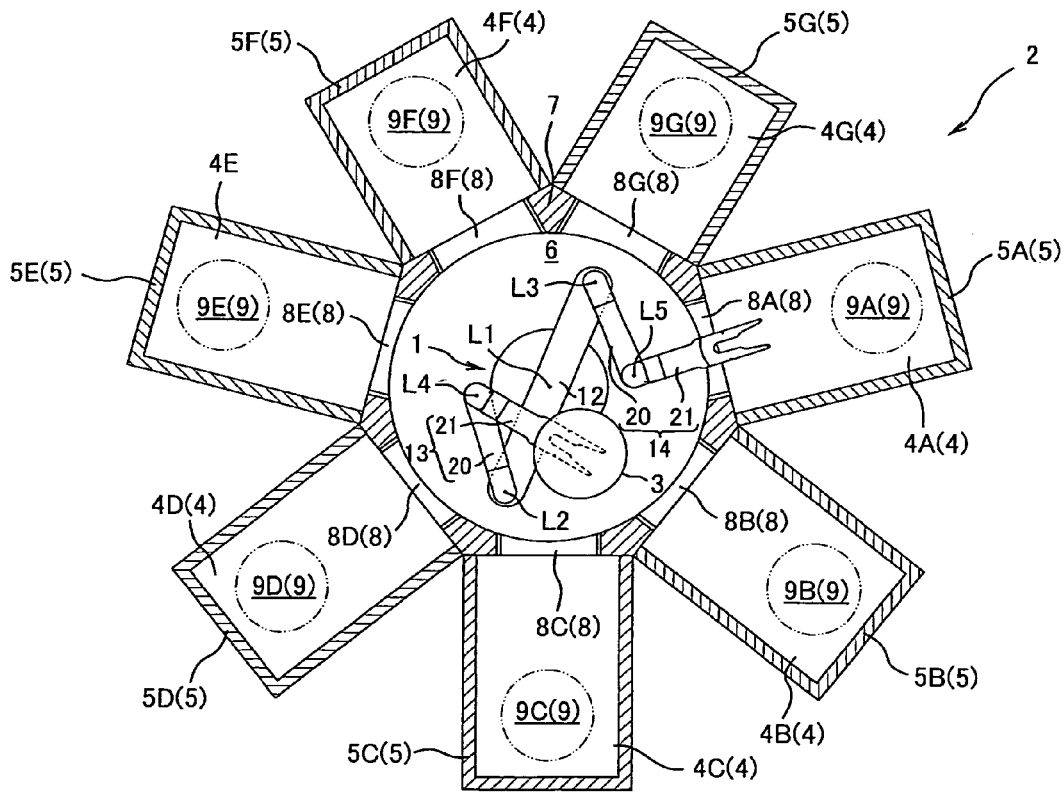
FIG. 32 is a plan view showing the transferring apparatus when the second hand mechanism is extended from the state of FIG. 31 and the hand is inserted into the gate.
Figure 33:
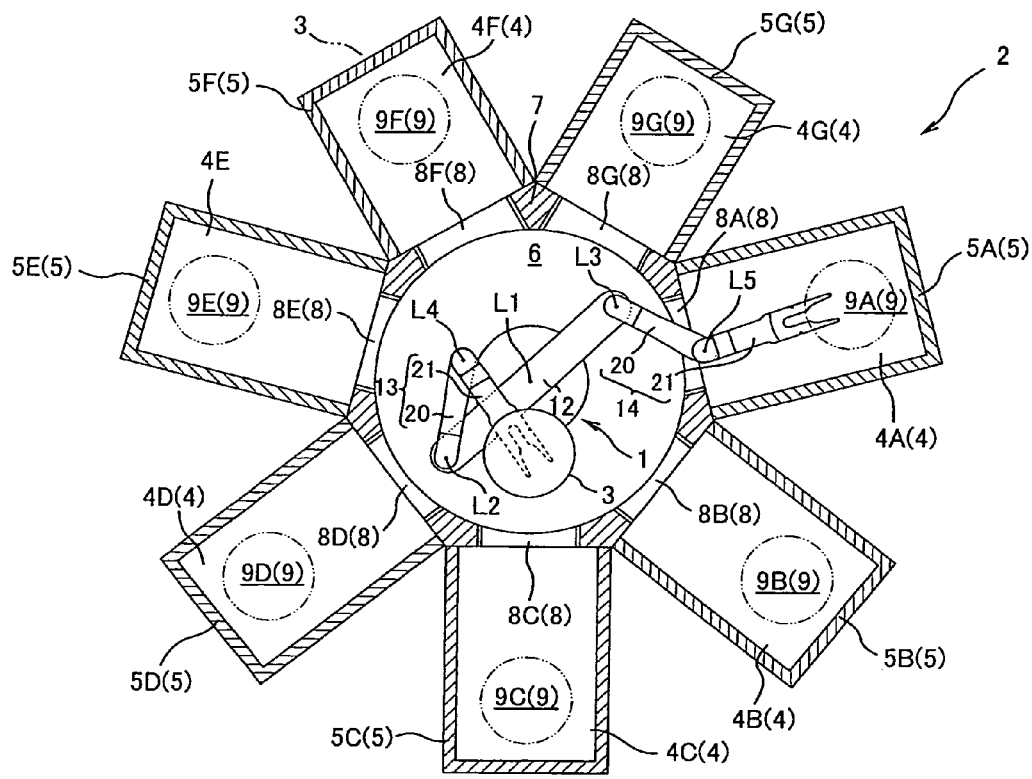
FIG. 33 is a plan view showing the transferring apparatus when the second hand mechanism is further extended from the state of FIG. 32 and the hand is moved up to the vicinity of the mounting position.
Figure 34:
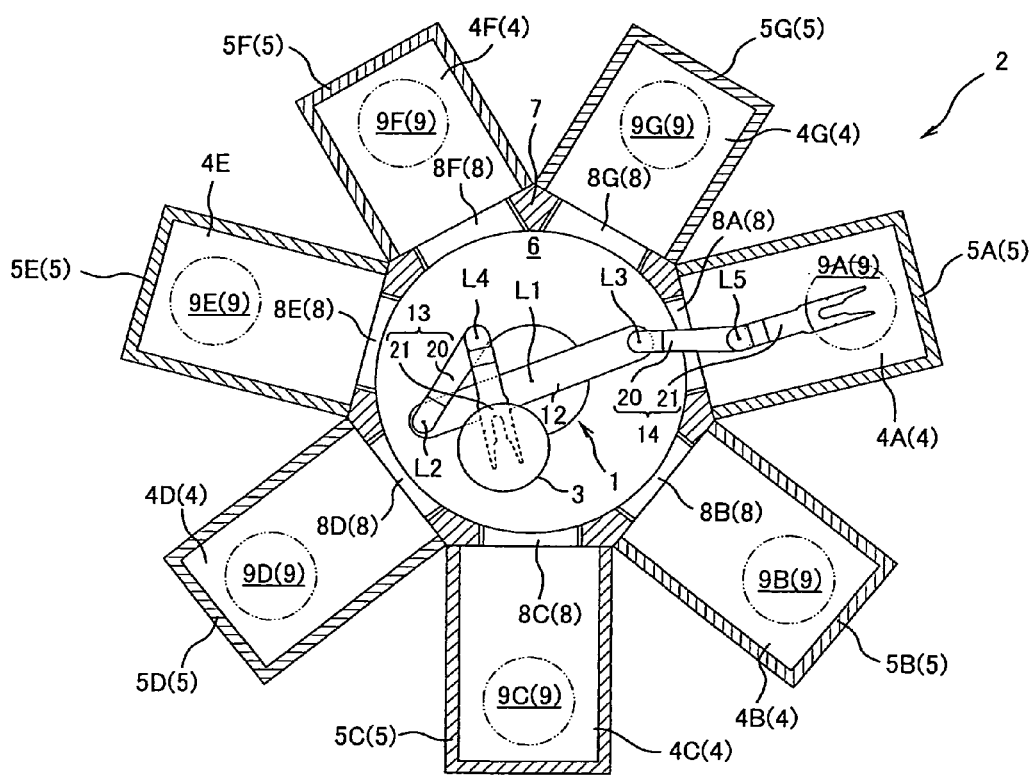
FIG. 34 is a plan view showing the transferring apparatus when the second hand mechanism is further extended from the state of FIG. 33 and the hand is moved up to the mounting position.

Next, a case where the reduction ratio is set to 1.65 will be explained. The control unit 50 carries out the same control operations as a case where the reduction ratio is set to 1.0, and inserts the hand 21 of the second hand mechanism 14 into the treatment room 4A (see FIGS. 31 and 32). As with a case where the reduction ratio is set to 1.35, the hand 21 of the second hand mechanism 14 inserted into the gate 8A is moved substantially linearly with respect to the gate 8A when and after it is inserted into the gate 8A (see FIG. 33). Then, the hand 21 of the second hand mechanism 14 reaches the mounting position 9A while preventing the arm 20, the hand 21, and the wafer 3 held by the hand 21 from contacting the transferring chamber 7 or the process chamber 5A (see FIG. 34). As above, when the reduction ratio is set to 1.65, the hand 21 of the second hand mechanism 14 can be moved substantially linearly with respect to the gate 8A, and the hand 21, the arm 20, and the wafer 3 can be prevented from contacting the transferring chamber 7.

Figure 35:
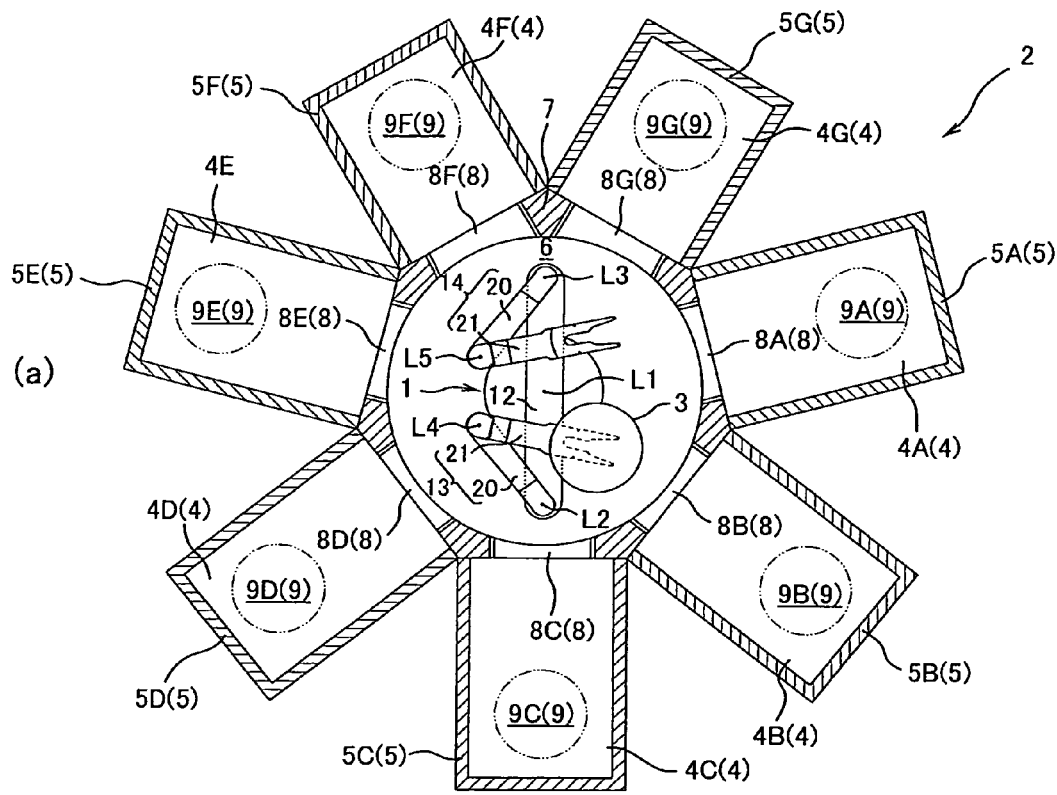
FIG. 35 is a plan view showing the transferring apparatus in the initial posture when the reduction ratio is 2.0.
Figure 36:
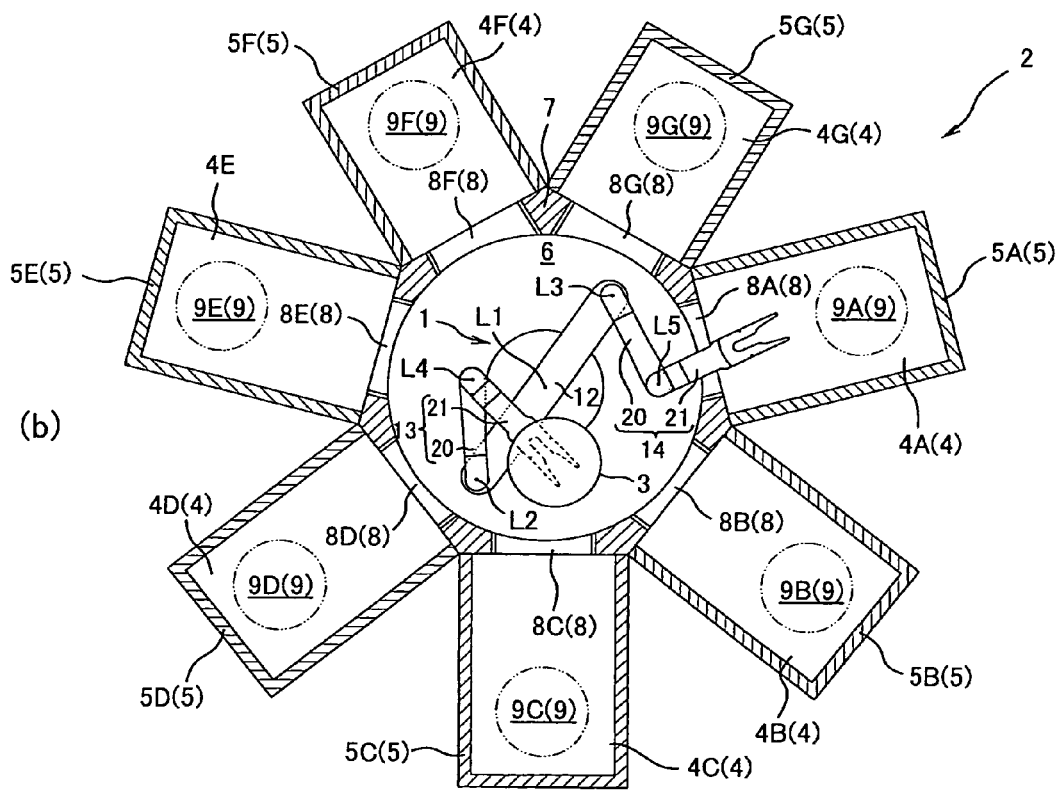
FIG. 36 is a plan view showing the transferring apparatus when the second hand mechanism is further extended from the state of FIG. 35 and the hand is moved up to the vicinity of the mounting position.
Figure 37:
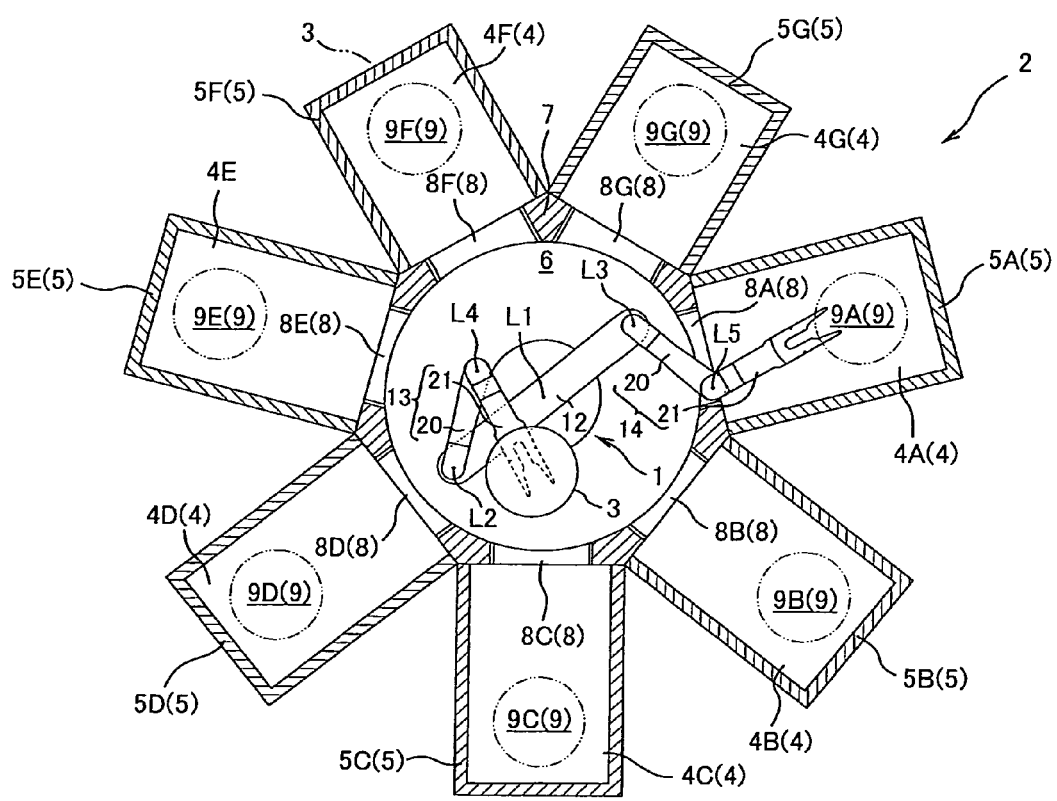
FIG. 37 is a plan view showing the transferring apparatus when the second hand mechanism is further extended from the state of FIG. 37 and the second hand mechanism contacts the chamber.

Finally, a case where the reduction ratio is set to 2.0 will be explained. The control unit 50 carries out the same control operations as a case where the reduction ratio is set to 1.0, and inserts the hand 21 of the second hand mechanism 14 into the treatment room 4A (see FIGS. 35 and 36). The second hand mechanism 14 inserts the hand 21 into the gate 8A with the arm 20 and the hand 21 bent. Therefore, the hand 21 is inserted into the gate 8A with the posture thereof inclined slightly. After the hand 21 is inserted, it is moved forward to the mounting position 9A. Here, since the reduction ratio is large, the second hand mechanism 14 does not extend adequately but is inserted into the gate 8A. Therefore, a connection portion where the arm 20 and hand 21 of the second hand mechanism 14 are connected to each other projects in a width direction of the gate 8A. On this account, when the hand 21 is moved forward to the mounting position 9A, the connection portion contacts the transferring chamber 7 (to be precise, a right side portion when viewed from the transferring room 6 toward the opening of the gate 8A) (see FIG. 37). As above, when the reduction ratio is set to 2.0, the second hand mechanism 14 does not extend adequately but is inserted into the gate 8A. Therefore, the second hand mechanism 14 contacts the transferring chamber 7.

Although not shown, the same results as above are obtained when the hand 21 is inserted into each of the process chambers 5B to 5G. To be specific, when the reduction ratio is set to 1.0 or 2.0, the second hand mechanism 14 contacts the transferring chamber 7. When the reduction ratio is set to 1.35 or 1.65, the second hand mechanism 14 can reach the mounting position 9 without contacting the transferring chamber 7. The same is true for the first hand mechanism 13.

As above, when the reduction ratio is set to 1.35 or 1.65, the hand 21 can be moved substantially linearly from the gate 8 toward the mounting position 9, and the wafer 3 held by the hand 21 can be transferred while preventing the wafer 3 from contacting the transferring chamber 7 or the process chamber 5. Although not shown for the entire range, by changing the reduction ratio, the posture of the hand 21 becomes straight as the reduction ratio becomes closer to about 1.55 from 1.35 or 1.65. To be specific, the reduction ratio is preferably about 1.55. If the reduction ratio is set in a range of not lower than 1.35 and not higher than 1.65, the hand 21 can be moved substantially linearly from the gate 8 toward the mounting position 9, and the wafer 3 held by the hand 21 can be transferred while preventing the wafer 3 from contacting the transferring chamber 7 or the process chamber 5.

As above, by setting the reduction ratio in a range of not lower than 1.35 and not higher than 1.65, the transferring apparatus 1 can move the hand 21 substantially linearly from the gate 8 toward the mounting position 9 and transfer the wafer 3 held by the hand 21 while preventing the wafer 3 from contacting the transferring chamber 7 or the process chamber 5. As above, the hand 21 can be moved substantially linearly. Therefore, as compared to a case where the reduction ratio is set to 1.0 or 2.0, the gate 8 can be reduced in width, and the outer size of each of the transferring chamber 7 and the process chamber 5 can be reduced.

Moreover, in accordance with the transferring apparatus 1 of the present embodiment, the first intermediate pulley 35 and the second intermediate pulley 45 are arranged so as to be the same in height as each other. Therefore, as compared to a case where the intermediate pulleys 35 and 45 are arranged to be lined up in the upper-lower direction, it is possible to reduce the height of the transferring apparatus 1. With this, the transferring room 6 in which the transferring apparatus 1 is arranged can be reduced in height, and the transferring chamber 7 and the semiconductor processing equipment 2 can be reduced in height.

Further, in accordance with the transferring apparatus 1, the driving shafts 32 and 42 and the revolution shaft 19 are arranged so as to be lined up along the revolution axis L1, and the driving shafts 32 and 42 are inserted through the revolution shaft 19. Further, the second driving shaft 42 is inserted through the first driving shaft 32. Therefore, the outer diameter of the revolution shaft 19 can be reduced, and an installation space for the revolution shaft 19 and the driving shafts 32 and 42 can be reduced. In addition, the outer diameter of the bellows 51 covering the revolution shaft 19 can be reduced. With this, the manufacturing cost can be reduced.

Other Embodiment

The present embodiment has explained the semiconductor processing equipment 2 including the heptagonal transferring chamber 7. However, the shape of the transferring chamber 7 is not limited to the above shape. The transferring chamber 7 may have any shape, such as a hexagon, an octagon, the other polygon, a circle, or an oval. The same is true for the process chamber 5. The shapes of the revolving base 13, arm 20, hand 21 of the transferring apparatus 1 are not limited as long as the above-described operations can be carried out.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A transferring apparatus comprising:
a revolving link configured to revolve about a predetermined revolution axis;
two hand mechanisms, each of which is configured to hold a wafer and both of which are attached to the revolving link so as to be rotatable about two rotating axes, respectively, the rotating axes being parallel to the revolution axis; and
two hand drive mechanisms configured to rotate the hand mechanisms, respectively, wherein:
each of the hand mechanisms includes an arm attached to the revolving link so as to be rotatable about the rotating axis and configured to be rotated by the hand drive mechanism; a hand provided at the arm so as to be rotatable about a hand axis parallel to the rotating axis and configured to hold the wafer; and an interlock mechanism configured to rotate the hand in conjunction with rotation of the arm,
the interlock mechanism includes a rotating axis pulley fixed to the revolving link so as to be rotatable about the rotating axis; a hand axis pulley provided at the arm so as to be rotatable about the hand axis; and a hand belt hanging between the hand axis pulley and the rotating axis pulley,
the interlock mechanism is configured such that a reduction ratio of rotation of the hand to rotation of the arm is not lower than 1.35 and not higher than 1.65, and
the hand is fixed to the hand axis pulley.

2. The transferring apparatus according to claim 1, wherein:
each of the hand drive mechanisms includes an arm drive motor, an arm output shaft rotated by the arm drive motor, an intermediate pulley rotated in conjunction with the arm output shaft, an arm pulley fixed to the arm so as to be rotatable about the rotating axis, and an arm belt hanging between the intermediate pulley and the arm pulley; and
the intermediate pulleys of the two hand drive mechanisms are arranged in an internal space of the revolving link so as to be the same in height as each other.

3. The transferring apparatus according to claim 2, wherein one of the arm output shafts of the two hand drive mechanisms is formed to have a tubular shape, and the other arm output shaft is inserted in said one of the arm output shafts.

4. The transferring apparatus according to claim 1, further comprising:
a revolution drive mechanism configured to revolve the revolving link; and
a controller configured to control operations of the revolution drive mechanism and the two arm drive motors, wherein:
the controller is configured to rotate the arm and the hand by the arm drive motor to extend the hand mechanism; revolve the revolving link by the revolution drive mechanism; and move the hand linearly in a direction in which the hand faces.

5. A transferring apparatus comprising:
a revolving link configured to revolve about a predetermined revolution axis;
two hand mechanisms, each of which is configured to hold a wafer and both of which are attached to the revolving link so as to be rotatable about two rotating axes, respectively, the rotating axes being parallel to the revolution axis; and
two hand drive mechanisms configured to rotate the hand mechanisms, respectively,
wherein each of the hand mechanisms includes an arm attached to the revolving link so as to be rotatable about the rotating axis and configured to be rotated by the hand drive mechanism; a hand provided at the arm so as to be rotatable about a hand axis parallel to the rotating axis and configured to hold the wafer; and an interlock mechanism configured to rotate the hand in conjunction with rotation of the arm,
wherein the interlock mechanism is configured such that a reduction ratio of rotation of the hand to rotation of the arm is not lower than 1.35 and not higher than 1.65,
wherein each of the hand drive mechanisms includes an arm drive motor, an arm output shaft rotated by the arm drive motor, an intermediate pulley rotated in conjunction with the arm output shaft, an arm pulley fixed to the arm so as to be rotatable about the rotating axis, and an arm belt hanging between the intermediate pulley and the arm pulley; and
wherein the intermediate pulleys of the two hand drive mechanisms are arranged in an internal space of the revolving link so as to be the same in height as each other.

6. The transferring apparatus according to claim 5, wherein one of the arm output shafts of the two hand drive mechanisms is formed to have a tubular shape, and the other arm output shaft is inserted in said one of the arm output shafts.

* * * * *